(12) United States Patent
Yamazaki

(10) Patent No.: US 6,218,714 B1
(45) Date of Patent: Apr. 17, 2001

(54) INSULATED GATE SEMICONDUCTOR DEVICE AND METHOD OF MANUFACTURING THE SAME

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/907,579

(22) Filed: Aug. 8, 1997

(30) Foreign Application Priority Data

Aug. 13, 1996 (JP) .................................................. 8-232552

(51) Int. Cl.⁷ .................................................. H01L 29/76
(52) U.S. Cl. .......................................... 257/404; 257/402
(58) Field of Search ............................... 257/20, 24, 345, 257/402–404, 654, 392

(56) References Cited

U.S. PATENT DOCUMENTS

| | | | |
|---|---|---|---|
| 4,697,198 | * 9/1987 | Komori et al. | 257/345 |
| 5,210,437 | * 5/1993 | Sawada et al. | 257/392 |
| 5,350,940 | * 9/1994 | Rona | 257/402 |

FOREIGN PATENT DOCUMENTS

| | | | |
|---|---|---|---|
| 61-256769 | * 11/1986 | (JP) | 257/345 |
| 2-31464 | * 2/1990 | (JP) | 257/345 |
| 2-159070 | * 6/1990 | (JP) | 257/345 |
| 2-196468 | * 8/1990 | (JP) | 257/345 |
| 2-203566 | * 8/1990 | (JP) | 257/345 |
| 5-283687 | * 10/1993 | (JP) | 257/345 |
| WO 88/03328 A1 | 5/1988 | (WO) . | |

OTHER PUBLICATIONS

Kowk. K. Ng, "Complete Guide to Semiconductor Devices," 1995, pp. 164–165.*

* cited by examiner

Primary Examiner—Olik Chaudhuri
Assistant Examiner—Nathan W. Ha
(74) Attorney, Agent, or Firm—Fish & Richardson P.C.

(57) ABSTRACT

Dot-pattern-like impurity regions 104 are artificially and locally formed on a channel forming region 103. The impurity regions 104 restrain the expansion of a drain side depletion layer toward the channel forming region 103 to prevent the short channel effect. The impurity regions 104 allow a channel width W to be substantially fined, and the resultant narrow channel effect releases the lowering of a threshold value voltage which is caused by the short channel effect.

37 Claims, 14 Drawing Sheets

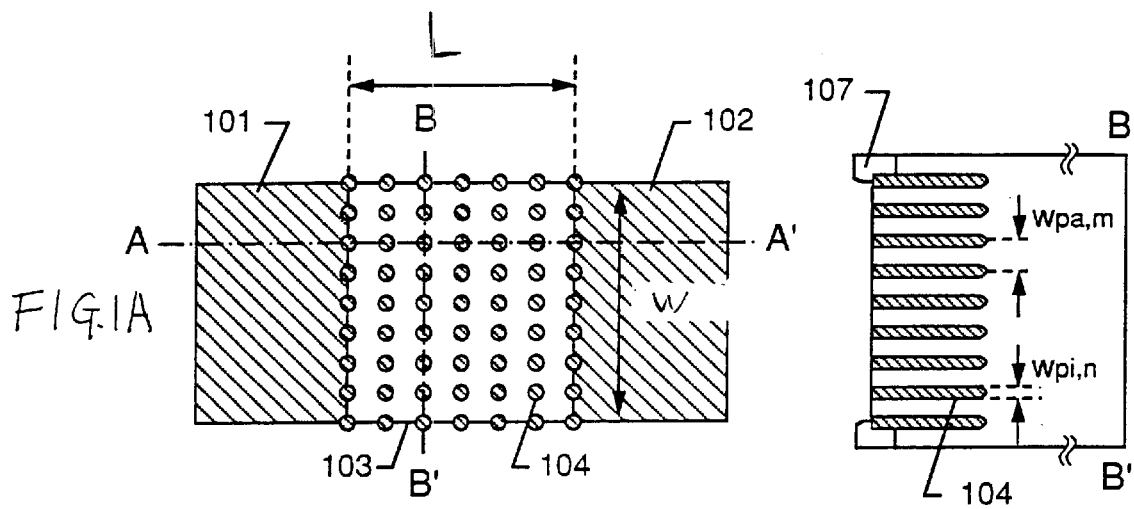
FIG. 1A
FIG. 1C
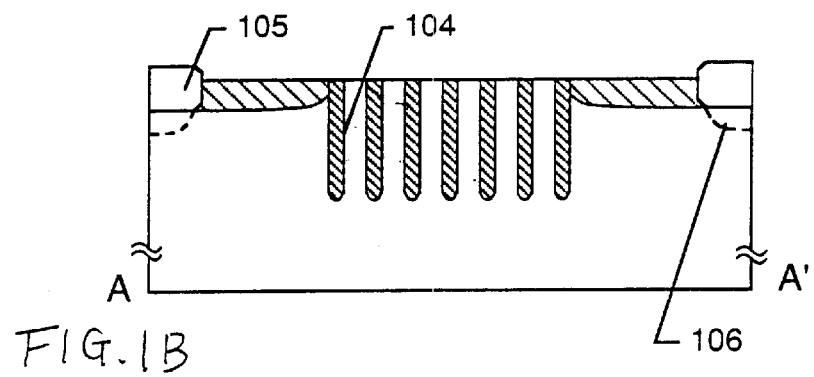
FIG. 1B
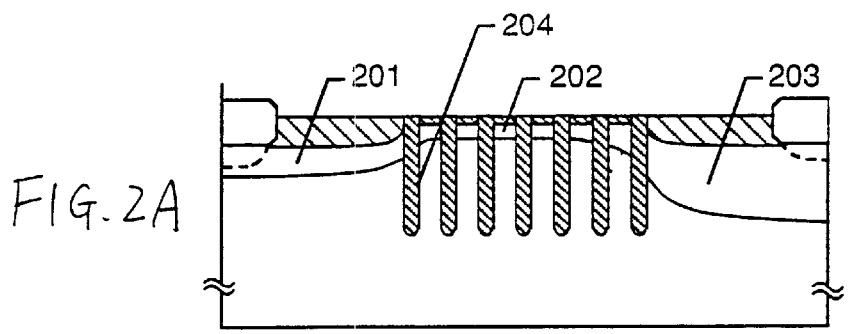
FIG. 2A
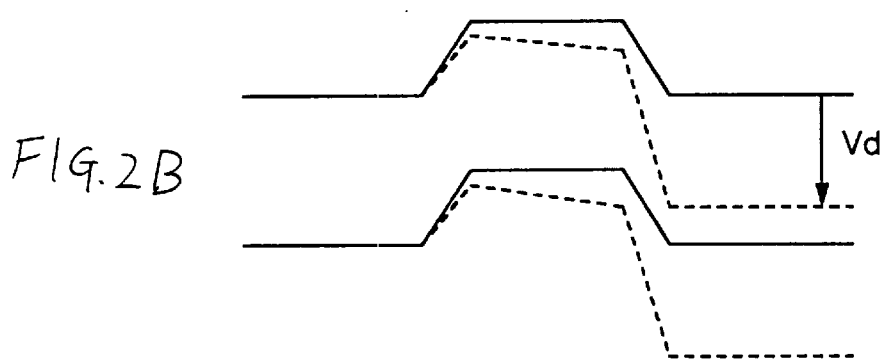
FIG. 2B

PMOS | NMOS

PMOS | NMOS | NPN BIPOLAR

Eg = Eg
△E < △E'

INSULATED GATE SEMICONDUCTOR DEVICE AND METHOD OF MANUFACTURING THE SAME

BACKGROUND OF THE INVENTION

1. Field of the Invention

The present invention relates to the structure of an insulated gate semiconductor device formed using a crystalline by semiconductor substrate, for example, a monocrystal silicon substrate or an SOI substrate (SIMOX or the like), and more particularly to the structure of an insulated gate field effect transistor (hereinafter referred to simply as "IG-FET") and a method of manufacturing the same. The present invention relates to a technique of which advantages are especially exhibited in the case of manufacturing a fine device whose channel length is 1 μm or less (representatively, 0.01 to 0.35 μm).

Therefore, the present invention is applicable to a semiconductor integrated circuit such as an IC, a VLSI or a ULSI, which is structured with integrated IG-FETs.

2. Description of the Related Art

In recent years, integrated circuits such as the VLSI are kept on becoming more fine, and the machining dimensions in the order of a deep sub-micron are required, for example, the width of a wiring is 0.18 μm or less, further 0.1 μm or less.

Up to now, the fining of a semiconductor device is progressed in accordance with the scaling rule, and there has been generally known that the fining lead to an improvement in the characteristic of the integrated circuit. However, the fine machining in the order of the sub-micron suffers from a problem that it does not simply accord to the scaling rule.

The representative problem of this type as known is a phenomenon such as a short channel effect. The short channel effect is the phenomenon caused by the reason that as the line width of a gate electrode is shortened, that is, a channel formation region is shortened the charges in the channel formation region becomes to be largely influenced by not only a gate voltage but also the charges in a depletion layer, an electric field and a potential distribution of a source/drain region.

This state is simplified and shown in FIG. 3. Reference numeral 301 denotes a source region, reference numeral 302 denotes a drain region, reference numeral 303 denotes a channel region, and reference numeral 304 denotes a gate electrode. Also, a dotted line indicated by reference numeral 305 represents a depletion layer which is formed when a drain voltage Vd is small.

Normally, a current that flows in the channel region 303 is controlled by only a gate voltage Vg. In this case, as indicated by reference numeral 305, since the depletion layer which is in the vicinity of the channel region 303 is substantially in parallel with the channel, a uniform electric field is formed.

However, as the drain voltage Vd becomes high, the depletion layer which is in the vicinity of the drain region 302 is expanded toward the channel region 303 and the source region 301, with the result that as indicated by a solid line 306, the charge and the electric field in the drain depletion layer become to influence the depletion layer which is in the vicinity of the source region 301 and the channel region 303. In other words, an on-state current is changed according to a complicated electric field distribution, thereby making it difficult to control the current which flows in the channel region 303 by only the gate voltage Vg.

Here, an energy state in the periphery of the channel formation region when the short channel effect occurs will be described with reference to FIG. 4. In FIG. 4, state graphs indicated by solid lines represent energy bands of the source region 401, the channel formation region 402 and the drain region 403, respectively, when the drain voltage is 0 V.

In this state, when the drain voltage Vd which is sufficiently large is applied, the energy bands are changed into the states indicated by dotted lines in FIG. 4. In other words, the depletion charges and the electric field in the drain region 103 which are formed by the drain voltage Vd influence the charges in the depletion layers of the source and channel regions 401 and 402 so that an energy (potential) state is continuously changed from the source region 401 to the drain region 403.

The reduction of a threshold value voltage (Vth) and a punch-through phenomenon have been well known as an influence of such a short channel effect on the semiconductor device, for example, the IG-FET. Also, there has been known that a sub-threshold characteristic is deteriorated when an influence of the gate voltage on the drain current by the punch-through phenomenon is lowered.

First, the reduction of the threshold value voltage is a phenomenon that occurs in an n-channel FET and a p-channel FET, similarly. Also, the degree of the reduction depends on not only the drain voltage but also a variety of parameters such as the concentration of impurities in a substrate, the depth of source/drain diffusion layer, the thickness of a gate oxide film, a substrate bias and so on.

The reduction of the threshold value voltage is desirable from a viewpoint of lowering a power consumption, however, there generally arises such a disadvantage that a frequency characteristic is not increased because the drive voltage of the integrate circuit becomes small.

Under that circumstance, up to now, as means for controlling the threshold value voltage, it is general to uniformly add the impurity elements that give one conduction to the entire channel formation region, to control the threshold value voltage with the amount of addition of the impurity elements. However, even with this method, the short channel effect per se cannot be prevented, and the punch-through phenomenon is caused to occur. Also, since the added impurities allow carriers to be scattered, the mobility of carriers is caused to be lowered.

Also, the reduction of the sub-threshold characteristic which is accompanied by the punch-through phenomenon means that the sub-threshold coefficient (S value) is increased, that is, the switching characteristic of an FET is deteriorated. An influence of the short channel effect on the sub-threshold characteristic is shown in FIG. 5.

FIG. 5 is a graph taking the gate voltage Vg in a horizontal axis and the logarithm of the drain current Id in a vertical axis. The inverse number of a slope (sub-threshold characteristic) in the region 501 is an S value. In FIG. 5, the changes of characteristics when gradually shortening the channel length are compared, and the channel length is shortened toward a direction indicated by an arrow.

As a result, there can be confirmed that the slope of the characteristic is decreased, that is, the S value is tended to be increased with the channel length being shortened. This means that the switching characteristic of the FET is deteriorated with the channel length being shortened.

The above-description is made to the short channel effect in the case of extremely shortening the length of the channel formation region of the semiconductor device. In the case of extremely narrowing the width of the channel formation region, the phenomenon such as the narrow channel effect also occurs.

What is shown in FIG. 6 is a cross-sectional view showing a normal IG-FET being cut on a plane perpendicular to the channel direction (a direction connecting the source and the drain). Reference numeral 601 denotes a monocrystal silicon substrate, and reference numeral 602 denotes a field oxide film formed through the selectively oxidizing method. The respective semiconductor devices used in the VLSI are separated by the field oxide film 602, respectively.

Also, reference numeral 603 denotes a gate electrode to which a voltage is applied to form a channel region 604. Impurity region 605 is disposed below the field oxide film 602 and functions as a channel stopper.

The narrow channel effect is caused in such a manner that a bird beak portion is largely influenced which is an intrusion of the field oxide film 602 and the impurity region 605 into the channel region 604 is largely influenced as the channel width W is narrowed. In particular, there may be cited an increase in the threshold value voltage and a dependency of the effective channel width on a supply voltage.

In the existing semiconductor industry, a semiconductor integrated circuit which has been integrated up to the limit has been demanded, and it is important to which degree the fining of the respective semiconductor devices can be pursued. However, even if a technique to form a fine pattern in the order of the deep sub-micron is formed is developed, the problem of the above-mentioned short channel effect leads to a fatal obstacle that obstructs the fining of the device.

SUMMARY OF THE INVENTION

The present invention has been made in view of the above circumstances, and therefore an object of the present invention is to provide a technique for effectively restraining the short channel effect accompanied by the fining of the semiconductor device, thereby being capable of forming the fine device in the order of the deep sub-micron which was difficult to realize by the short channel effect.

In accordance with one aspect of the invention, the insulated gate semiconductor device comprises:
 a source region, a drain region and a channel forming region which are formed using a crystal semiconductor; and
 a gate insulating film and a gate electrode formed over said channel forming region,
 wherein said channel forming region includes a region in which carriers move, and at least one impurity region, formed artificially and locally, in order to pin a depletion layer that expands from said drain region toward said channel forming region and said source region, and
 wherein impurity elements that shift an energy band width (Eg) are added to said impurity region.

In accordance with another aspect of the invention, the insulated gate semiconductor device comprises:
 a source region, a drain region and a channel forming region which are formed using a crystal semiconductor; and
 a gate insulating film and a gate electrode formed over said channel forming region,
 wherein said channel forming region includes a region in which carriers move, and at least one impurity region, formed artificially and locally , in order to pin a depletion layer that expands from said drain region toward said channel forming region and said source region,
 wherein impurity elements that shift an energy band width (Eg) are added to said impurity region, and
 wherein said region in which the carriers move includes means for preventing the impurity scattering of the carriers or means for preventing the reduction of the mobility which is caused by a factor other than the scattering of a lattice of the carriers.

In accordance with still another aspect of the invention, the insulated gate semiconductor device comprises:
 a source region, a drain region and a channel forming region which are formed using a crystal semiconductor; and
 a gate insulating film and a gate electrode formed over said channel forming region,
 wherein said channel forming region includes a region in which carriers move, and at least one impurity region, formed artificially and locally, in order to control to a predetermined value voltage by the addition of impurity elements, and
 wherein impurity elements that shift an energy band width (Eg) are added to said impurity region.

In accordance with another aspect of the invention, the insulated gate semiconductor device comprises:
 a source region, a drain region and a channel forming region which are formed using a crystal semiconductor; and
 a gate insulating film and a gate electrode formed over said channel forming region,
 wherein said channel forming region includes a region in which carriers move, and at least one impurity region, formed artificially and locally , in order to controlled to a predetermined value voltage by the addition of impurity elements,
 wherein impurity elements that shift an energy band width (Eg) are added to said impurity region, and
 wherein said region in which the carriers move includes means for preventing the impurity scattering of the carriers or means for preventing the reduction of the mobility which is caused by a factor other than the scattering of a lattice of the carriers.

In accordance with another aspect of the invention, the insulated semiconductor device comprising:
 a source region, a drain region and a channel forming region which are formed using a crystal semiconductor;
 at least one impurity region artificially and locally in said channel forming region by addition of impurity elements that shift an energy band width (Eg) in said channel forming region; and
 a gate insulating film and a gate electrode formed over said channel forming region,
 wherein said impurity region has an insulating property, and
 wherein said impurity elements are not added or are added by a very small amount in a region other than said impurity region in said channel forming region.

It should be noted that no addition of impurity elements in a region other than the impurity region or a small amount of addition thereof means that a region (semiconductor layer) where a channel is formed is an intrinsic or substantially intrinsic region.

In the present specification, the intrinsic region is directed to a region to which impurity elements that give n-type or p-type and impurity elements such as carbon, nitrogen or oxygen are not intentionally added. Also, the substantially intrinsic region is directed to a region in which a conductive type which is caused even if impurity elements that give n-type or p-type are not intentionally added is offset, or a region that has the same conductive type as that of the source and drain regions in a range where the threshold value can be controlled.

Also, in the present specification, the intrinsic or the substantially intrinsic region is directed to a region where the concentration of phosphorus or boron is $5\times10^{17}$ atms/cm$^3$ or less, and the concentration of carbon, nitrogen or oxygen is $2\times10^{18}$ atms/cm$^3$ or less.

Also, in the present invention, as the above impurity elements, there may be used elements of group XIII (representatively boron) which can function as an acceptor that gives p-type conduction with respect to the n-channel FET. Further, there may be elements of group XV (representatively phosphorus and arsenic) which can function as a donor that gives n-type conduction with respect to the p-channel FET.

The impurity region added with these impurity elements function to change the energy band configuration of the channel region and to either increase or reduce the threshold voltage. Accordingly, the concentration of the added impurity in the impurity region should be sufficiently high to at least control the threshold voltage, for example, $1\times10^{17}$ to $1\times10^{20}$ atoms/cm$^3$, preferably, $1\times10^{18}$ to $1\times10^{19}$ atoms/cm$^3$.

The concentration of the impurity should be at least 100 times as high as the impurity concentration of the substrate (in a typical single crystal silicon substrate, it is about $1\times10^{15}$/cm$^3$), hence, $1\times10^{17}$/cm$^3$ is the lower limit. Also, if the concentration exceeds $1\times10^{20}$ atoms/cm$^3$, it is not desirable in view of the burden of the device.

In the present specification, monocrystal silicon is a representative example of a crystal semiconductor, and the monocrystal silicon includes not only a monocrystal silicon with a grade which is normally used in the level of the current VLSI, but also monocrystal silicon with a higher grade (to the extreme, monocrystal silicon of an ideal state such that it is fabricated in a universal space).

The subject matter of the present invention is to effectively restrain the expansion of a drain depletion layer by an impurity region which is artificially locally formed in the channel formation region, thereby preventing the punch-through phenomenon and the reduction of the sub-threshold characteristic accompanied by that phenomenon which are problems in the prior art.

Since the IG-FET of the present invention looks like as if pins of an impurity region are formed in the channel forming region, the present applicant calls it "pining type transistor". In the present specification, "pining" means "restraint", and "to pin" means "to restrain" or "to suppress".

Also, another subject matter of the present invention is to release by artificially producing the narrow channel effect the reduction of the threshold value voltage which is a representative phenomenon caused by the short channel effect accompanied by fining of the channel length.

What is shown in FIG. 1A is a schematic diagram showing states of a source region, a drain region and a channel forming region of a normal IG-FET when being viewed from a top surface thereof. Reference numeral 101 denotes a source region, reference numeral 102 denotes a drain region, and reference numeral 103 denotes a channel forming region.

The feature of the present invention resides in that an impurity region 104 is formed like a dot pattern within the channel forming region 103. In the present invention, as the impurities to be added, phosphorus (P) or arsenic (AS) is used with respect to the p-channel FET whereas boron (B) is used with respect to the n-channel FET.

The added impurities form an energy barrier which is locally large in an energy band width within the channel forming region 103. For example, in the case where boron (B) that gives p-type conduction is added with respect to the n-channel FET, an energy band which has been in a state shown in FIG. 14A is changed to a state shown in FIG. 14B, and Fermi level (Ef) is shifted whereby a barrier ΔE becomes a larger barrier ΔE'. It is needless to say that in this case, the shifting of the Fermi level results in the shifting of an energy band in the channel forming region.

This region has an inverse conductivity and provides a satisfactory barrier from the energy viewpoint though its resistance is low. Likewise, in the case where phosphorus or arsenic is added with respect to the p-channel FET, an inverse conductive region is formed so that it can be applied as an energy barrier.

In particular, as shown in FIG. 1A, since the junction region of the drain region 102 and the channel forming region 103 is a region where an electric field is most remarkably changed, it is desirable that the impurity region 104 is disposed at this position. Also, in the case where an electric field caused by the gate electrode reaches the inside of the drain region 102, the impurity region 104 may extend into the drain region 102. Reversely, it is preferable that no impurity region 104 is formed within the source region 101.

Further,, the prevent invention is extremely effective in forming a fine device that requires the fine machining in the order of the deep sub-micron such as a size of 0.2 μm, further 0.1 μm, because the length of the channel forming region (the channel length or a distance between the source and the drain) is also shortened to 0.01 to 1.0 μm, representatively, 0.01 to 0.35 μm, the impurity region must be cut into a finer pattern.

For example, in the case of employing a resist mask in forming an impurity region having a dot pattern shape, patterning for forming openings in the resist mask cannot be performed by using an normal exposing method in consideration of a problem regarding the resolution. In such a case, patterning may be performed by using an electron drawing method or an FIB method to realize a fine pattern.

Also, since the dot-pattern shaped impurity region is formed to be artificially arranged by patterning, it can be arranged not only as shown in FIG. 1A but also arbitrarily variously arranged.

Then, a description will be given hereinafter of how to restrain the short channel effect in driving an insulated gate semiconductor device (IG-FET) having the structure of the source region/channel forming region/drain region shown in FIG. 1A.

First, a cross-sectional view taken along a line A—A' of FIG. 1A is shown in FIG. 1B. Reference numeral 105 denotes a field oxide film., and reference numeral 106 denotes a channel stopper. The formation of the impurity region 104 is variable depending on the set conditions, however, a case in which the impurity region is injected in the form of a bar assuming that there is ideally no scattering will be described as an example.

Also, a cross-sectional view taken along a line B—B' of FIG. 1A is shown in FIG. 1C. Reference numeral 107 denotes a field oxide film. Normally, a channel stopper is disposed under the field oxide film, but in this example, it is omitted. The width of the impurity region 104 is indicated by Wpi,n, and its interval is indicated by Wpa,m. In this example, n and m means that within the channel forming region 103, Wpi, n is a width of the n-th impurity region, and Wpa,m is an interval between the m-th impurity regions (path through which carriers travel).

The above description was made simply to the structure, and its effect will be now described. First, in the case of applying a gate voltage and a drain voltage to a semiconductor device having a structure shown in FIG. 1B, a source side depletion layer 201, a channel side depletion layer 202 and a drain side depletion layer 203 are formed in a state shown in FIG. 2A. In other words, the drain side depletion layer 203 is prevented from expanding toward the source side by an impurity region 204 as a barrier.

Since the impurity region 204 (104) is disposed as shown in FIG. 1A, a model in which a lattice filter that blocks the channel forming region restrains the expansion of the drain side depletion layer facilitates the understanding of the present invention.

Hence, in the semiconductor device having the structure according to the present invention, as shown in FIG. 2A, the depletion layers are divided without being interfered with each other. In other words, since the source side depletion layer 201 and the channel side depletion layer 202 are distributed without being influenced by the drain side depletion layer 203, the energy state becomes a state shown in FIG. 2B.

In other words, since the energy state of the channel region is almost controlled by only an electric field caused by the gate voltage, which is different from the conventional energy state shown in FIG. 5, it has a substantially parallel shape with respect to the channel region. Therefore, with this structure, there arises no problem such as the punch-through phenomenon inherent to the short channel effect, thereby being capable of structuring a semiconductor device high in drain withstand voltage.

Furthermore, as shown in FIG. 2A, in the present invention, because a volume that occupies the depletion layer is reduced in comparison with the prior art shown in FIG. 3, the present invention has the feature that the charges of the depletion layer are smaller than those of the prior art, and that a capacitor in the depletion layer is small. In this example, an expression that leads an S value is represented by the following expression.

Expression 3

$$S=d(V_g)/d(\log Id)$$

Namely, as described above, it is understandable that the expression represents the inverse number of a slope in the region 501 in the graph shown in FIG. 5. Also, Expression 3 can be approximately represented by the following expression.

Expression 4

$$S \cong 1 \, n \, 10 \, kT/q[1+(Cd+Cit)/Cox]$$

In Expression 4, k is the Boltzmann's constant, T is an absolute temperature, q is the amount of charges, Cd is a capacity of the depletion layer, Cit is an equivalent capacity of an interfacial level, and Cox is a capacity of the gate oxide film. Hence, according to the present invention, since the capacity Cd of the depletion layer is sufficiently smaller than that of the prior art, the S value can be set to a small value of 85 mV/decade or less (preferably, 70 mV/decade or less), that is, an excellent sub-threshold characteristic can be obtained.

Also, the object of the present invention is to allow the capacity Cd of the depletion layer and the equivalent capacity Cit of the interfacial level to approach 0 as much as possible. In other words, they are allowed to approach an S value (60 mV/decade) in an ideal state of Cd=Cit=0.

Further, it is very important that the channel forming region is structured as shown in FIG. 1C for releasing the reduction of the threshold value voltage which is caused by the short channel effect. This is because the structure shown in FIG. 1C is a structure necessary for intentionally producing a narrow channel effect.

For example, when attention is paid to a cross section shown in FIG. 1C, the width W of the channel forming region is divided by the impurity region 104 so that it can be substantially regarded as an assembly consisting of a plurality of channel forming regions having a narrow channel width Wpa,m.

Namely, the narrow channel effect can be obtained in the plurality of regions having the narrow channel width Wpa,m. From the macro viewpoint, since the region where the narrow channel effect thus exists in the entire channel forming region as shown in FIG. 1A, it is considered that the narrow channel effect can be obtained as a whole, thus increasing the threshold value voltage.

Hence, even if the threshold value voltage is lowered by the short channel effect which is caused by shortening the channel length, the threshold value voltage is intentionally increased by the narrow channel effect so that the threshold value voltage can be controlled for the above reason, as a result of which a change in the threshold value voltage can be released.

Also, in accordance with a further another aspect of the invention, the method of manufacturing a semiconductor device comprising the steps of:
  forming a source region, a drain region and a channel forming region using a crystal semiconductor;
  forming at least one impurity region artificially and locally in said channel forming region; and
  forming a gate insulating film and a gate electrode over said channel forming region;
  wherein impurity elements that shift an energy band width (Eg) are artificially and locally added to said impurity region.

In accordance with further still another structure of the invention, the method of manufacturing a semiconductor device comprising the steps of:
  forming a source region, a drain region and a channel forming region using a crystal semiconductor;
  forming a gate insulating film and a gate electrode on said channel forming region; and
  artificially and locally adding impurity elements that shift an energy band width (Eg) to said channel forming region, in order to form at least one impurity region which pins a depletion layer that expands from said drain region toward said channel forming region and said source region.

In accordance with further still another aspect of the invention, a method of manufacturing a semiconductor device comprising the steps of:
  forming a source region, a drain region and a channel forming region using a crystal semiconductor;
  forming a gate insulating film and a gate electrode on said channel forming region;
  artificially and locally adding impurity elements that shift an energy band width (Eg) to said channel forming region, in order to form at least one impurity region which is controlled to a predetermined threshold value voltage by addition of impurity elements and controls a path through which the carriers move.

Further, in accordance with another aspect of the invention, a method of manufacturing a semiconductor device comprising the steps of:

forming a source region, a drain region and a channel forming region using a crystal semiconductor; and artificially and locally forming at least one impurity region by addition of impurity elements that shift an energy band width (Eg) in said channel forming region; and forming a gate insulating film and a gate electrode formed over said channel forming region;

wherein said impurity region has an insulating property; and wherein said impurity elements are not added or are added by a very small amount in a region other than said impurity region in said channel forming region.

BRIEF DESCRIPTION OF THE DRAWINGS

These and other objects, features and advantages of the present invention will become more fully apparent from the following detailed description taken with the accompanying drawings in which:

FIGS. 1A to 1C are diagrams showing the structure of a channel forming region;

FIGS. 2A and 2B are diagrams showing the structure of the channel forming region;

DETAILED DESCRIPTION OF THE PREFERRED EMBODIMENTS

Figure 3:
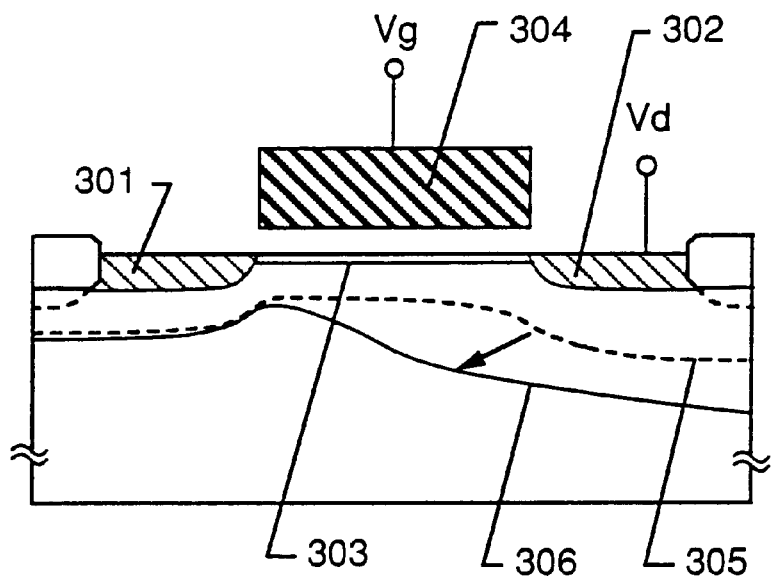
FIG. 3 is a diagram for explaining a conventional semiconductor device.
Figure 4:
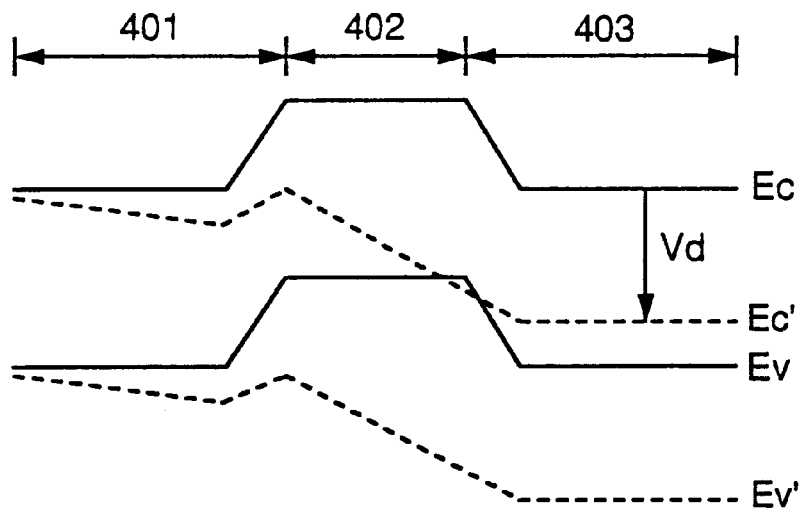
FIG. 4 is a diagram showing an energy state of the channel forming region.
Figure 5:
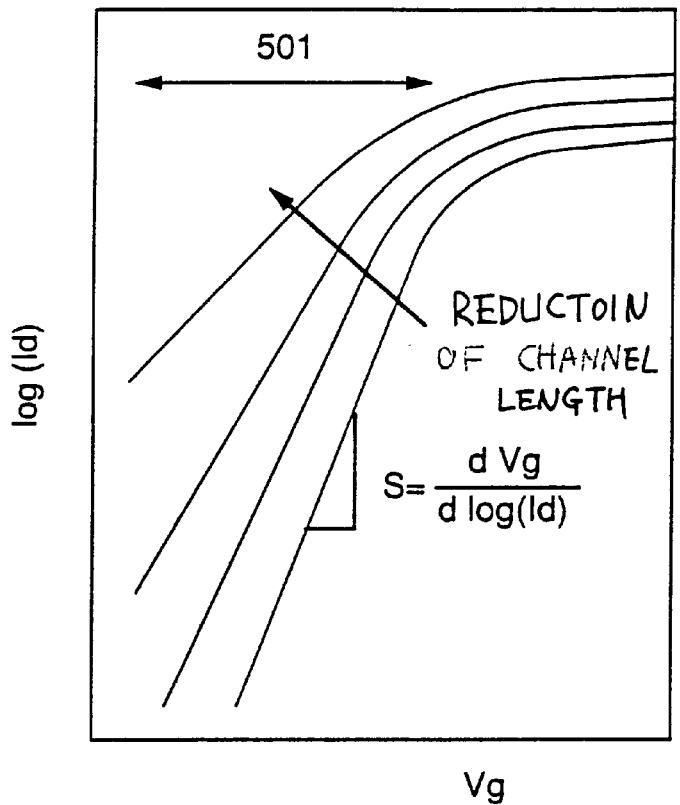
FIG. 5 is a graph explaining a characteristic of the conventional semiconductor device.
Figure 6:
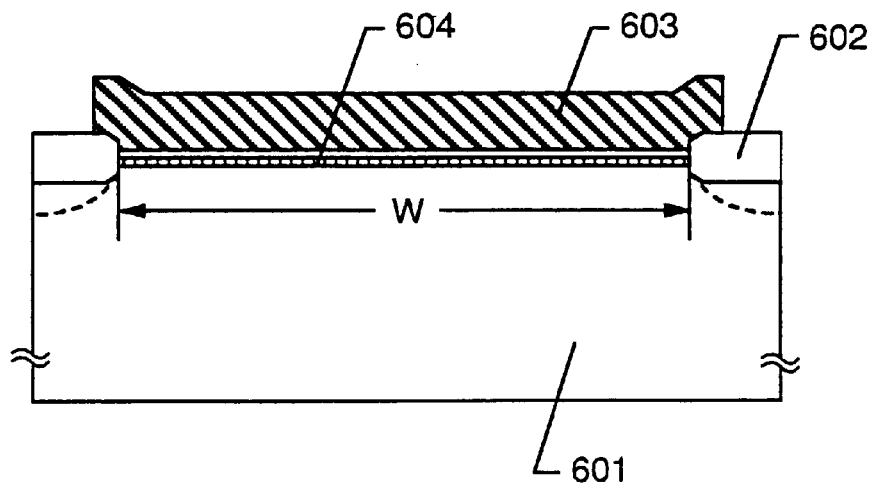
FIG. 6 is a diagram showing the structure of the conventional semiconductor device.

In FIGS. 1A to 1C, a region interposed between a source region 101 and a drain region 102 forms a channel forming region 103. In the present invention, impurities are artificially and locally to the channel forming region 103 to form an impurity region 104.

Also, the impurity regions 104 are shaped in a dot pattern and arranged according to a rule. In the present invention, since as the impurities which are added to the impurity regions, boron is used in case of the n-channel FET whereas phosphorus or arsenic is used in case of p-channel FET, there is no case in which carriers pass through the impurity regions having the inverse conduction. In other words, the channel region is formed only between the impurity regions, and the carriers move through the channel regions as a path.

In the case of driving the semiconductor device thus structured, a drain side depletion layer formed in the vicinity of the drain region 102 does not expand laterally (under the channel forming region) because it is stopped by the impurity region 104. In other words, since an energy state (potential state) in the vicinity of the source region 101 and the channel forming region 103 is not influenced by the drain side depletion layer, the respective electric fields are substantially independently formed.

Therefore, the punch-through phenomenon and the reduction of the sub-threshold characteristic which are caused by so-called short channel effect are prevented, thereby being capable of realizing a high drain withstand voltage.

Also, the impurity region 104 substantially narrows the channel width, and the so-called narrow channel effect is produced between the impurity regions 104. Therefore, the reduction of the threshold value voltage which is caused by the short channel effect can be released or offset by an increase of the threshold value voltage which is caused by the narrow channel effect.

Hereinafter, a description will be given in more detail of preferred embodiments of the present invention with the above structure with reference to the accompanying drawings.

Embodiment 1

An example in which an insulated gate electric field effect transistor is formed on a monocrystal silicon substrate in accordance with the present invention will be described with reference to FIGS. 7A to 7E. In this embodiment, for simplification of description, there is shown an example in which a single n-channel FET is formed on a p-type silicon substrate.

Figure 7A:
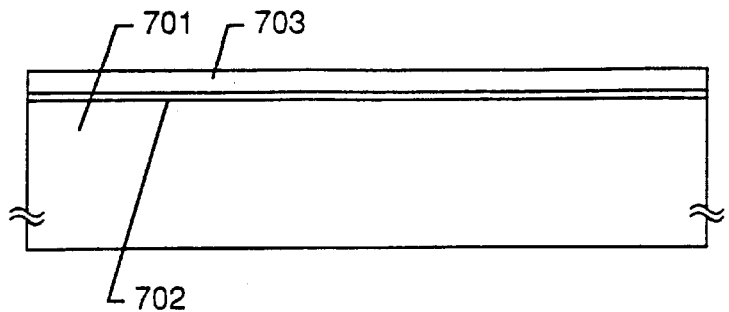
FIGS. 7A to 7E are diagrams showing a process of manufacturing an insulated gate field effect transistor.

First, reference numeral 701 denotes a p-type silicon substrate on which a silicon oxide film 702 is formed as a pad oxide film on which a silicon nitride film 703 that functions as a mask which will be used later for selective oxidation is further formed. The thickness of the silicon oxide film 702 and the silicon nitride film 703 may be 500 to 2000 Å (FIG. 7A).

Then, patterning is conducted so that the silicon nitride film 703 remains only in the device formation region, and in this state, ions of impurity elements that give p-type conduction are implanted into the substrate. Thereafter, wet oxidation is conducted at a temperature of 1000 to 1100° C.

Figure 7B:
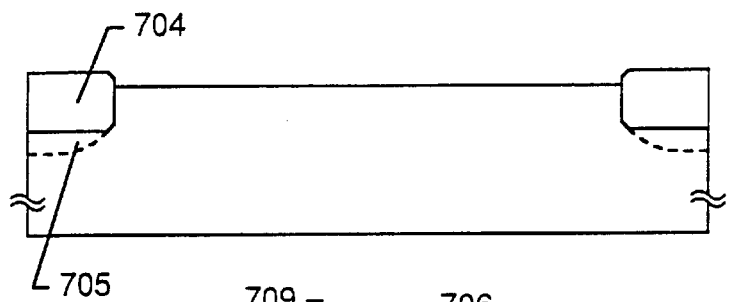

A silicon surface exposed through this process is selectively heat-oxidized to form a field oxide film 704 shown in FIG. 7B. The field oxide film 704 has a function to insultingly separate elements from each other.

Also, the impurity elements (B) that give p-type conduction which have been implanted through the above-mentioned ion implanting process form a channel stopper 705 under the field oxide film 704. This is a region that prevents a channel from being formed under the field oxide film 704, and normally provides the same conduction as that of a host substrate (a p-type silicon substrate in this embodiment).

Then, the silicon nitride film 703 and the silicon oxide film (pad oxide film) 702 are removed to obtain a state shown in FIG. 7B. In the selective oxidizing process of this type, there can be used a variety of selective oxidizing method such as the LOCOS method, the PLANOX method, the Isoplanar method or SWAMI method.

Subsequently, boron that gives an opposite conduction is added to the channel forming region 706 to form impurity regions 707 that function as a stopper of the depletion layer. The region 707 to which the impurity elements are added may be selectively designed such that holes are defined in a resist not shown through patterning. Also, it is desirable to use an ion implantation method in order to form the fine impurity regions 707.

It should be noted that in order to shape the impurity region 707 in a dot pattern, an extremely fine lithography technique is required. To achieve this, a light shaped in the dot pattern may be exposed using the technique using an electronic beam (electron drawing method) or a technique using an ion beam (FIB method).

In this situation, it is desirable that intervals Wpa, m between the respective impurity regions 707 (refer to FIG. 1C) are made equal with each other. This is because there is a possibility that the threshold value voltage is dispersed (which is caused by the dispersion of the narrow channel effect) or heating is dispersed (which is caused by the dispersion of a density of a current that flows between the impurity regions).

Also, the substrate may be heated during the ion implantation in order to activate the doped impurity. The activation efficiency can by improved by increasing the RF power of the ion implantation.

After completion of addition of the impurities, a heat oxidizing process is conducted to form a heat oxide film 708 of 100 to 500 Å. The thin heat oxide film 708 formed through heat oxidizing process unctions as a gate insulating film as it is.

Figure 7C:
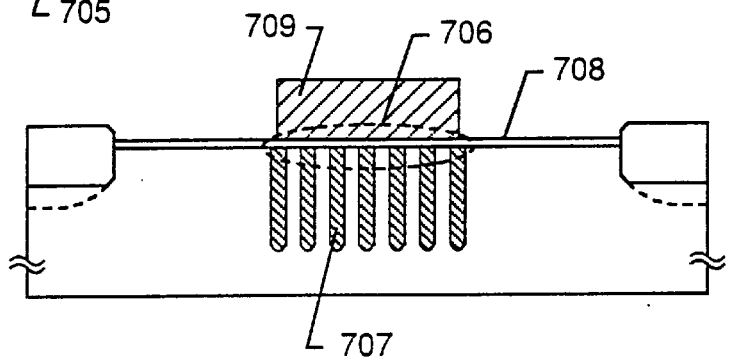

Furthermore, in the channel forming region 706, a polysilicon film is formed on the oxide film 708 as a gate electrode 709. The impurity elements are added to the polysilicon film during the deposition so that the polysilicon film provides conductivity. Thus, a state shown in FIG. 7C is obtained.

Figure 7D:
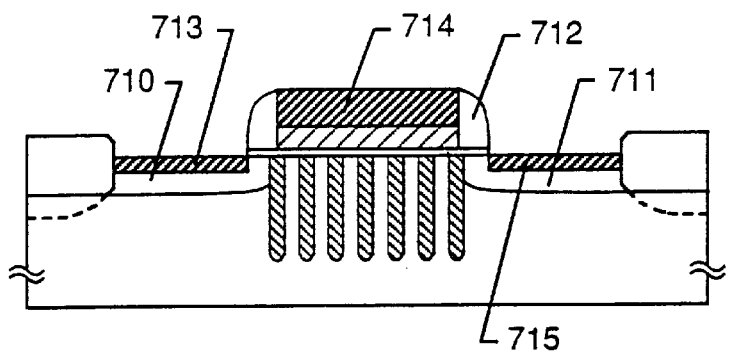

Thereafter, as shown in FIG. 7D, impurity elements (P or As) that give n-type conduction are added to form a source region 710 and a drain region 711 in a self aligning manner. Subsequently, a silicon nitride film is formed in thickness of 3000 Å so as to cover the gate electrode 709, and a side wall 712 is allowed to remain only on both side surfaces of the gate electrode 709 by using the etch back method.

Then, a titanium film is formed on the entire surface through the sputtering method in this state, and silicide is formed through means such as heating, laser annealing or lamp annealing. Through this process, titanium silicides 713 to 715 are formed on the surface of the source region 710 and the drain region 711 and on the surface of the gate electrode 709. Since the titanium suicides 713 to 715 are extremely low resistant, it is preferable to ensure those silicides being in ohmic contact with wirings which will be formed later.

Figure 7E:
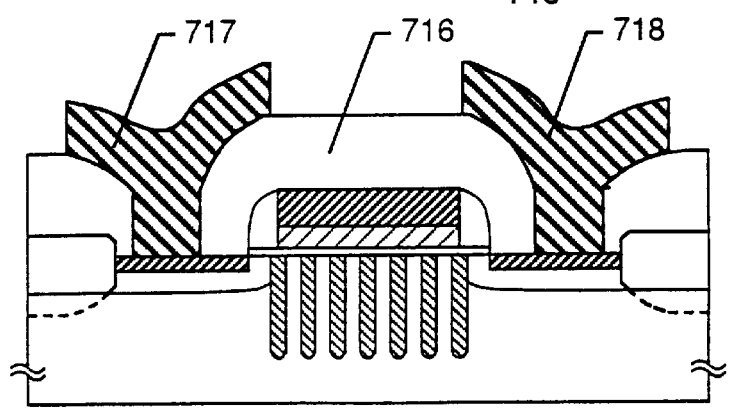

After completion of formation of the silicides, a silicon nitride film 716 is formed as an interlayer insulating film, and contact holes are formed therein to form a source electrode 717 and a drain electrode 718. Thus, an IG-FET having a structure shown in FIG. 7E is completed.

The present invention is characterized in that the impurity region is formed in the form of a dot pattern in the channel forming region of the IG-FET. Positions at which the dot pattern is formed are required to satisfy conditions with a certain limit. This will be described with reference to FIG. 8.

Figure 8A:
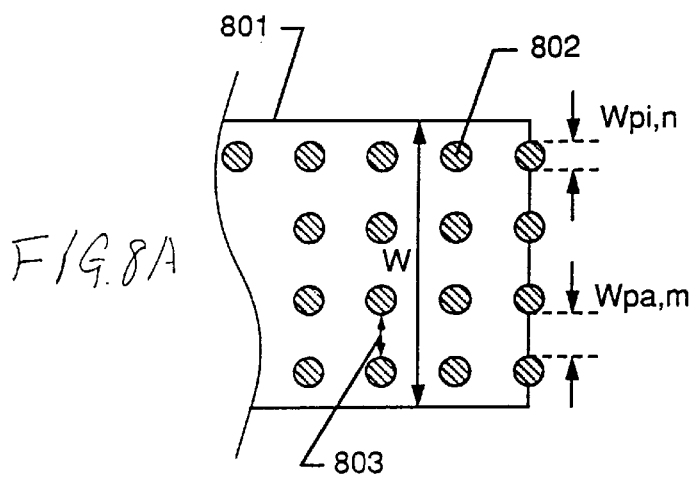
FIGS. 8A to 8C are diagrams for explaining conditions for forming impurity regions.

In FIG. 8, reference numeral 801 denotes a part of the channel forming region, where the channel width is indicated by W. In this example, a width which is occupied by a dot pattern 802 in the channel width W is defined by Wpi. The value of Wpi is sufficiently set to, for example, 10 to 100 Å. Also, if the widths of the arbitrary dot pattern 802 are wpi,$_1$, wpi,$_2$, wpi,$_3$, ... wpi,$_n$, then Wpi is represented by the following expression.

$$Wpi = \sum_{n=1}^{n} w_{pi,n} \quad [\text{EXPRESSION 1}]$$

In order to achieve the structure of the present invention, since it is required that at least one impurity region is formed in a region other than the end portions of the channel forming region, n is an integer of 1 or more.

A width occupied by regions between a dot pattern (current flowing paths) 803 in the channel width W is defined by Wpa. The value of Wpa can be set to, for example, 100 to 3000 Å (representatively 500 to 1500 Å). Also, if regions 803 between the arbitrary dot pattern are wpa,$_1$, wpa,$_2$, wpa,$_3$, ... wpa,$_m$, Wpa is represented by the following expression.

$$Wpi = \sum_{m=1}^{m} w_{pa,m} \quad [\text{EXPRESSION 2}]$$

Since it is required that at least one impurity region is formed in a region other than the end portions of the channel forming region as described above, the channel forming region is divided into two, and m is an integer of 2 or more.

In other words, the total channel width W accomplishes the relations of W=Wpi+Wpa and that (n+m) is 3 or more. Then, the respective relations of W and Wpi, W and Wpa, and Wpi and Wpa desirably satisfy the following conditions together.

Wpi/W=0.1 to 0.9
Wpa/W=0.1 to 0.9
Wpi/Wpa=⅑ to 9

What is meant by those expressions are that Wpa/W or Wpi/W must not be 0 or 1. For example, in case of Wpa/W=0 (the same meaning as that of Wpi/W=1), since the channel forming region is completely closed by the impurity region as shown in FIG. 8B, there comes to a state in which no path through which a current flows exists.

Figures 8B, 8C:
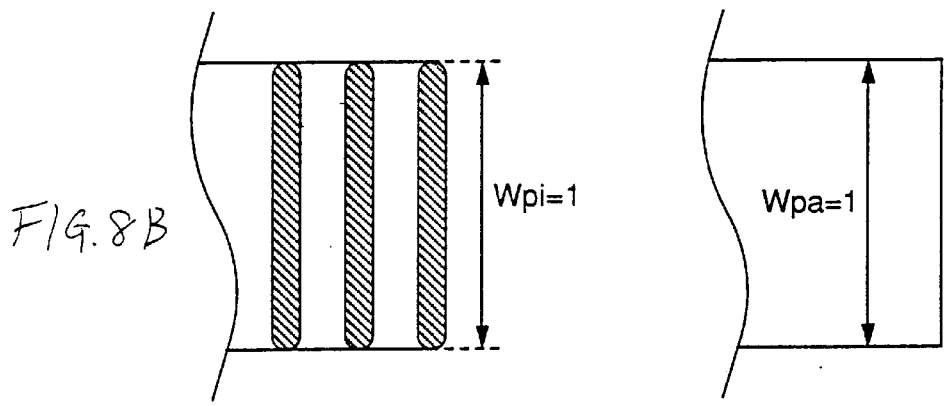

Reversely, in case of Wpa/W=1 (the same meaning as that of Wpi/W=0), since the impurity region does not exist in the channel forming region at all as shown in FIG. 8C, the expansion of the drain side depletion layer cannot be restrained.

For the above reasons, it is desirable that the relational expressions of Wpa/W and Wpi/W fall into a range of 0.1 to 0.9 (preferably 0.2 to 0.8), and also Wpi/Wpa=⅑ to 9 is satisfied. It should be noted that if the channel length is L, a channel formation area is represented by W×L.

Also, the prevent invention is effective in an improvement of the mobility that is a representative parameter which exhibits the performance of an FET. The reason will be described below.

The mobility is determined in accordance with the scattering of carriers in a semiconductor (a silicon substrate in this embodiment), and the scattering in the silicon substrate is roughly classified into the lattice scattering and the impurity scattering. The lattice scattering is low in the concentration of impurities in the silicon substrate and controllable at a relatively high temperature, and the impurity scattering is high in the concentration of the impurity and controllable at a relative low temperature. The entire mobility $\mu$ obtained by influencing them with each other is represented by the following expression.
EXPRESSION. 5

$$\mu = (1/\mu l + 1/\mu i)^{-1}$$

The expression 5 means that the entire mobility $\mu$ is reversely proportional to a sum of the inverse number of the mobility $\mu_l$ ($_l$ means lattice) when being influenced by the lattice scattering and the inverse number of the mobility $\mu_i$ ($_i$ means impurity) when being influenced by the impurity scattering.

In this example, in the lattice scattering, if a drift electric field is not much strong, an acoustic phonon plays the significant role, and the mobility $\mu_l$ at that time is proportional to $-3/2$ power of a temperature as indicated in the following expression. Hence, it is determined in accordance with the effective mass (m*) of the carriers and the temperature (T).
EXPRESSION. 6

$$\mu_l (m^*)^{-5/2} T^{-3/2}$$

Also, the mobility $\mu_i$ caused by the impurity scattering is proportional to $3/2$ power of the temperature as indicated by the following expression and inversely proportional to the concentration $N_i$ of the impurities ionized. In other words, the mobility $\mu_i$ can be changed by adjusting the concentration N of the ionized impurities.
EXPRESSION. 7

$$\mu_i (m^*)^{-1/2} N_i^{-1} T^{3/2}$$

According to the above expressions, in the channel dope where the impurities are added to the entire channel forming region as in the prior art, the mobility cannot be increased because of an influence of the impurity scattering. However, in the present invention, since the impurity regions are locally formed, no impurity is added between the adjacent impurity regions (a region having a width of Wpa).

In other words, because the expression 7 logically means that the concentration $N_i$ of impurities of the ionized impurities approaches 0 without limit, the mobility $\mu_i$ approaches infinite without limit. In other words, the expression 5 means that the impurities are reduced to the degree that a term of $1/\mu_i$ can be ignored, the entire mobility $\mu$ approaches the mobility $\mu_l$ without limit.

Also, it is logically possible that the effective mass (m*) of the carriers is reduced so that the mobility $\mu_l$ is further increased. This is performed by employing a phenomenon by which the effective mass of the carriers (in particular, in case of electrons) is changed depending on the axial direction of a crystal axis in a region of an extremely low temperature.

According to a literature, when it is structured such that a channel direction connecting between the source and the drain (a direction along which carriers are moved) is identical with <100> axial direction of a monocrystal silicon, the minimum effective mass can be obtained.

Figure 15:
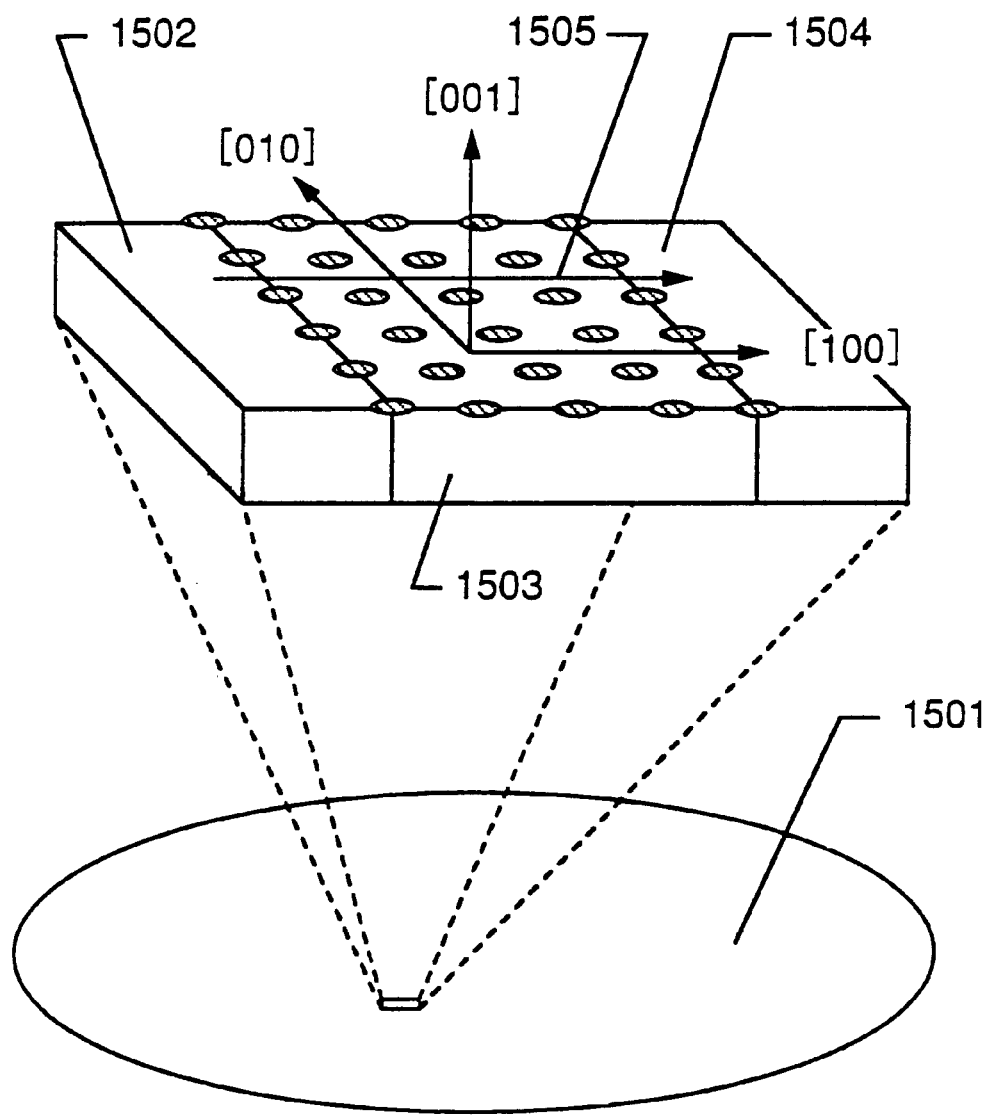
FIG. 15 is a diagram showing the structure of the channel forming region.

For example, as shown in FIG. 15, it is assumed that a monocrystal silicon substrate 1501, a source region 1502 a channel forming region 1503 and a drain region 1504 are formed on a monocrystal silicon substrate 1501 having a (100) face. In this situation, a case in which a channel direction 1505 is [100] corresponds to this example. This example is a result in a region of an extremely low temperature of 4° K.

Also, it is desirable that the channel direction and the axial direction (arranging direction) of the impurity region 707 are made substantially in parallel with the axial direction of the crystal lattices (an axial replacement is within ±10°) so that the carriers well move between the crystal lattices. In case of monocrystal, since the silicon atoms are regularly arranged, the carriers which move in parallel to a direction along which the crystal lattices are arranged are hardly influenced by the scattering of the lattices.

For example, if the rotating axis in the above direction in the monocrystal silicon substrate is 0°, then in case of the rotating axes of 90°, 180° and 270°, the same effect can be obtained.

Also, in the present invention, the impurity regions are formed using P (phosphorus) with respect to the p-channel FET, and because phosphorus has a property of gettering metal elements, it has an effect of removing metal elements, etc., which cause scattering from a path into which a current flows and fixing the removed metal elements to the impurity regions.

As described above, the carriers that move in the channel forming region pass through a region other than the impurity regions which exist within the channel forming region. This appearance will be briefly described with reference to a schematic diagram of FIGS. 16A to 16C.

Figure 16A:
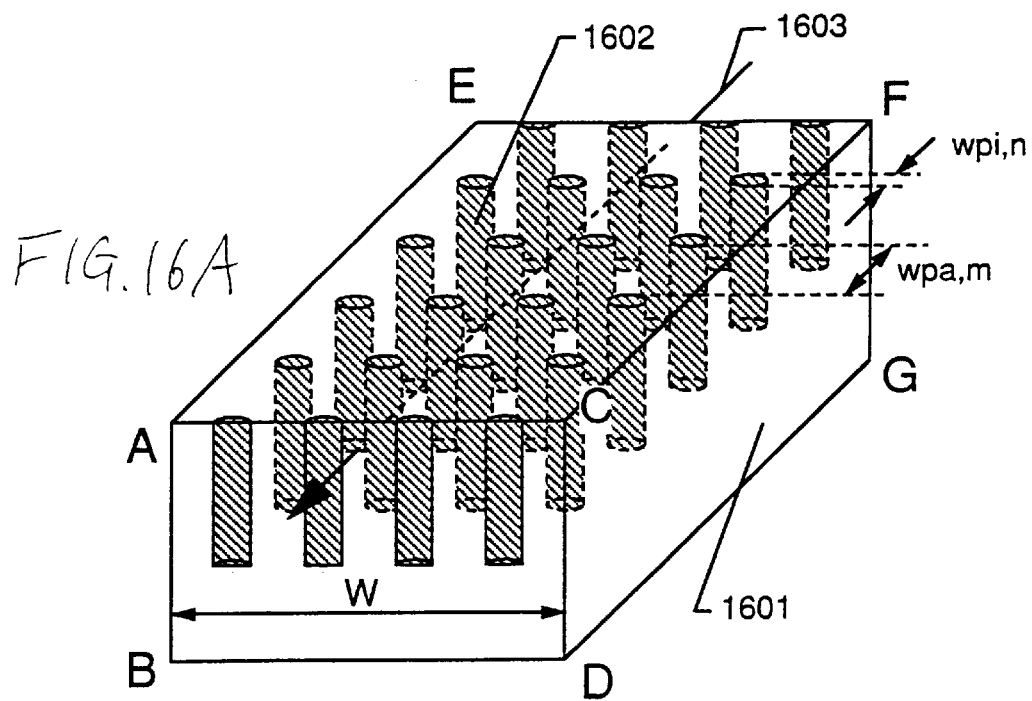
FIGS. 16A to 16C are diagrams showing the structure of the channel forming region.

In FIG. 16A, reference numeral 1601 denotes a channel forming region. In other words, FIG. 16A is a diagram showing the channel forming region viewed from an obliquely right top. The channel forming region according to the present invention has an impurity region 1602 as shown in FIG. 16A, three-dimensionally.

An arrow 1603 shown in FIG. 16A denotes a progressive direction of the carriers (electrons or holes). As shown in FIG. 16A, a plurality of impurity regions 1602 are disposed within the channel forming region 1601, and the carriers pass through a region other than those impurity region 1602.

Figure 16B:
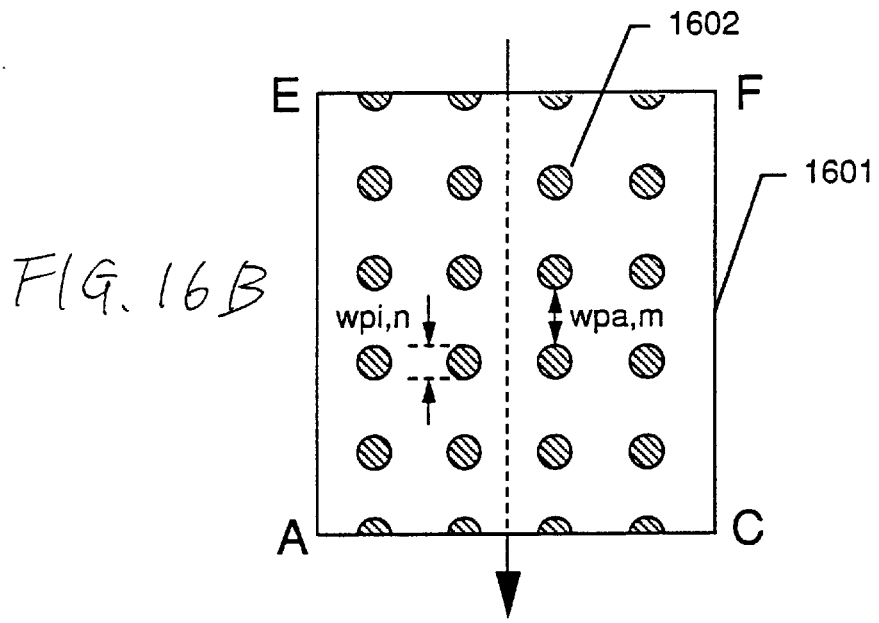

The progressive direction of the carriers looks as shown in FIG. 16B when being viewed from the top surface of the channel forming region 1601. FIG. 16B is a diagram showing a surface indicated by ACEF in FIG. 16A. It is understandable from FIG. 16B that the carriers move in a region having no impurity scattering while avoiding the impurity regions 1602.

In other words, as indicated by the arrow, most of the carriers; go between the impurity regions 1602 and move between the source and the drain. It is needless to say that the carriers move zigzag such that they avoid the impurity regions.

Figure 16C:
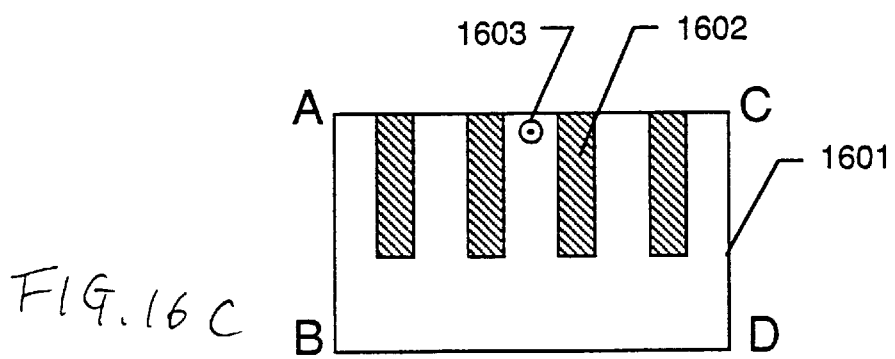

Also, what is shown in FIG. 16C is a diagram viewed from a side surface of the channel forming region 1601. FIG. 16C is a diagram showing a surface represented by ABCD in FIG. 16A. What is denoted by reference numeral 1603 is an arrow which is directed toward this side from the paper. It is understandable from the figure that the carriers move between the impurity regions 1602.

Embodiment 2

In this embodiment, there is shown an example of structuring a CMOS circuit with a complementary combination of an n-channel FET (NMOS) and a p-channel FET (PMOS) in accordance with the present invention. Although the details of a process of manufacturing the CMOS circuit will be omitted here, the impurity regions shaped in a dot pattern is formed only in the channel forming region before forming the gate insulating film according to the present invention, as was described in the embodiment 1.

Figure 13A:
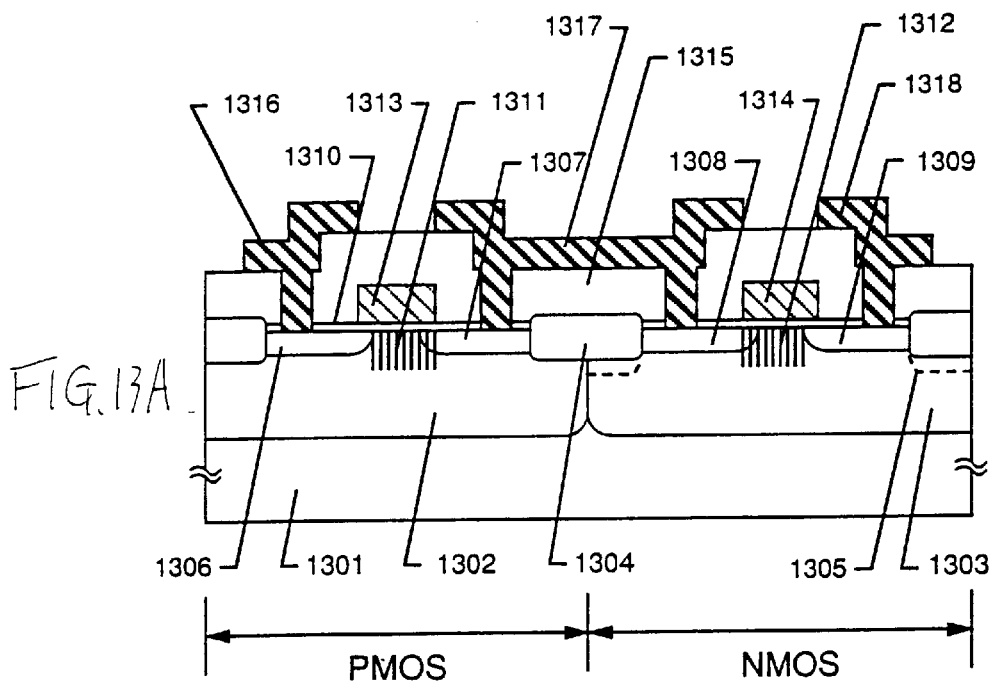
FIGS. 13A and 13B are diagrams showing the structure of the insulated gate field effect transistor.

FIG. 13A shows a cross-sectional view of a CMOS circuit in accordance with the present invention. FIG. 13A is a cross-sectional view of the CMOS circuit cut along the channel direction, which is formed through a normal manufacturing method.

In FIG. 13A, reference numeral denotes an n-type silicon substrate, reference numeral 1302 denotes a n-well, and reference numeral 1303 denotes a p-well. In other words, a p-channel FET (PMOS) is formed on the n-well 1302, and an n-channel FET (NMOS) is formed on the p-well 1303.

The NMOS and PMOS are divided by a field oxide film 1304 which has been formed through the selective oxidizing method, respectively, and a channel stopper 1305 is disposed under the p-well side field oxide film.

Also, impurities that give p-type conduction, for example, boron is added to the n-well 1302 so that a source region 1306 and a drain region 1307 of the PMOS are disposed. Further, impurities that give n-type conduction, for example, phosphorus or arsenic is added to the p-well 1303 so that a drain region 1308 and a source region 1309 of the NMOS are disposed.

In the channel forming regions interposed between the source region 1306 and the drain region 1307, and between the source region 1308 and the drain region 1309, respectively, impurity regions 1311 and 1312 shaped in a dot pattern are formed before forming a gate insulating film 1310.

The reason why the impurity regions 1311 and 1312 are formed before formation of the gate insulating film 1310 in this embodiment is to prevent an interface between the gate insulating film 1310 and the channel forming region from being damaged. However, a method of adding the impurities through the gate insulating film 1310 may be applied.

It should be noted that in this embodiment, in forming the impurity regions 1311 and 1312, the impurity elements to be added must be properly used for the NMOS and the PMOS. In this embodiment, boron is used with respect to the NMOS, and phosphorus is used with respect to the PMOS. The impurity elements which are added to the PMOS may be arsenic without any problems.

Also, in the case of the CMOS circuit as in the present invention, it is desirable that the impurity regions 1311 and 1312 are formed even within the drain regions 1307 and 1308 as shown in FIG. 13A.

When the semiconductor device of the present invention is used, for example, for a device such that the source and the drain are exchanged as in a pixel, impurity regions may extend to both of the source region and the drain region.

Then, gate electrodes 1313 and 1314 which are made of a conductive material are formed on the channel forming region, and an interlayer insulation film 1315 is formed to cover those gate electrodes 1313 and 1314. Furthermore, contact holes are defined in the interlayer insulating film 1315 so that a source electrode 1316 of the PMOS, a common drain electrode 1317 of the PMOS and the NMOS, and a source electrode 1318 of the NMOS are disposed.

Since the CMOS structure having a structure shown in FIG. 13A can be fined without suffering from a problem such as the short channel effect in accordance with the present invention, an integrated, circuit extremely high in the degree of integration can be structured.

Also, there can be structured a BiCMOS circuit made up of the combination of the CMOS circuit shown in FIG. 13A and a bipolar transistor. An example of the BiCMOS circuit formed in accordance with the present invention is shown in FIG. 13B.

Figure 13B:
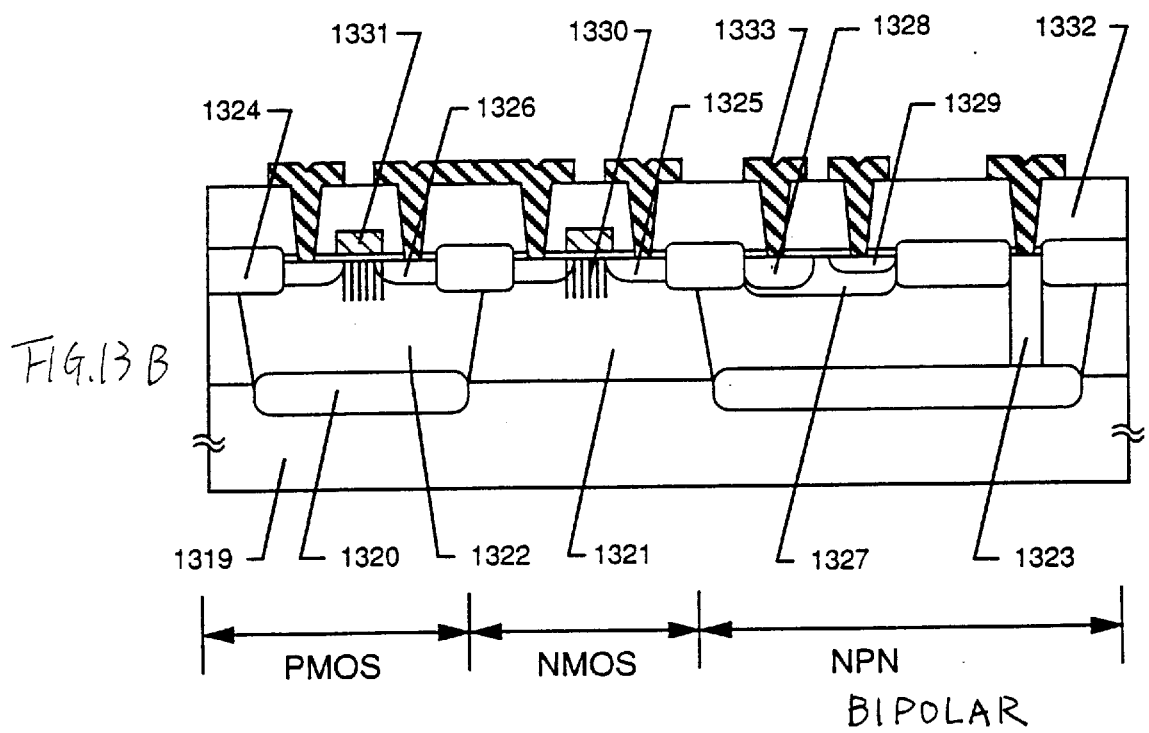
Figure 14A:
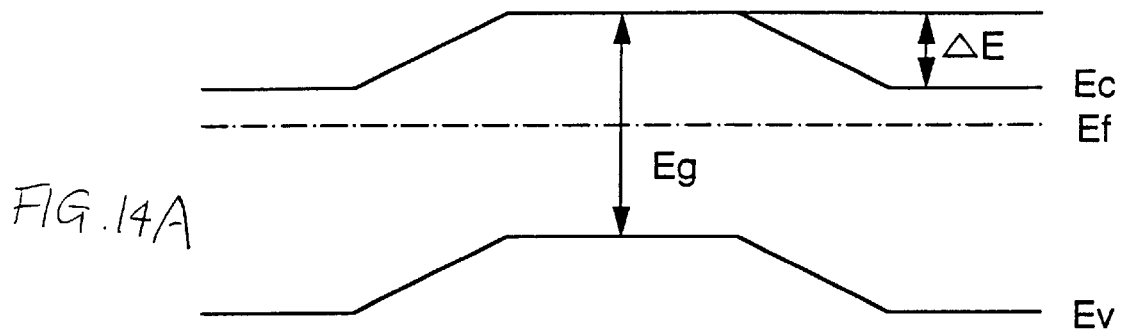
FIGS. 14A and 14B are diagrams showing energy states of the channel forming regions.
Figure 14B:
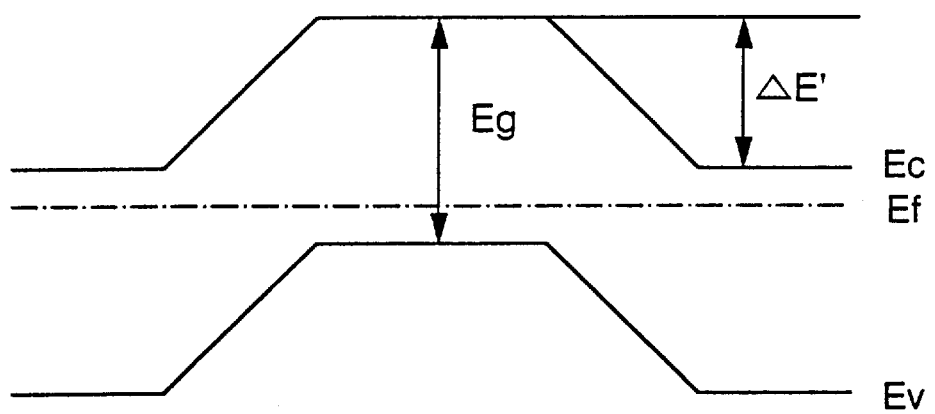

In FIG. 13B, reference numeral 1319 denotes a p-type silicon substrate, reference numeral 1320 denotes a buried n$^+$ region, and reference numeral 1321 denotes a p-well formed through the epitaxial growth. A p-well 1321 on the buried n$^+$ region 1320 is doped into n-type conduction to form an n-well 1322 that functions as a collector. Also, reference numeral 1323 denotes a deep n$^+$ region that forms an out put electrode from the buried n$^+$ region 1320.

Reference numeral 1324 denotes a field oxide film formed through a normal selective oxidizing method. An n$^+$ region 1325 is formed on the p-well 1321, and a p$^+$ region 1326 is formed on the n-well region 1322. On the n-well 1322 on a side where the bipolar transistor is structured, there is first formed a p$^-$ region 1327 that forms an active base, and there are then arranged a p$^+$ region 1328 and an n$^+$ region 1329.

It should be noted that an impurity region 1330 is formed in both of the PMOS and the NMOS. The impurity region 1330 may be formed after the n$^+$ region and the p$^+$ region have been formed, or before they have been formed. It is needless to say that the elements of group XIII are used in case of the NMOS whereas the elements of group XV are used in case of the PMOS.

Then, a gate electrode 1331, and interlayer insulating film 1332, and a source/drain wiring 1333 are disposed to structure a BiCMOS circuit. The BiCMOS circuit is structured to effectively use the high-speed operability of the bipolar transistor and the low power consumption property of the CMOS circuit together.

Embodiment 3

In the embodiment 1, a depthwise shape of the impurity region 707 is shaped in a bar. However, this is a shape under an ideal state where no scattering occurs when implanting ions. In fact, the impurity regions which are variously shaped can be formed depending on conditions of the ion implantation.

Figure 9A:
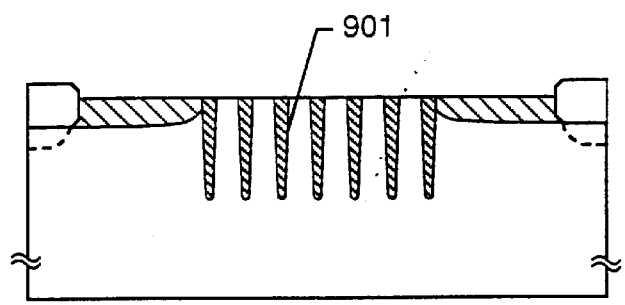
FIGS. 9A and 9B are diagrams for explaining the depthwise shape of the impurity regions.
Figure 9B:
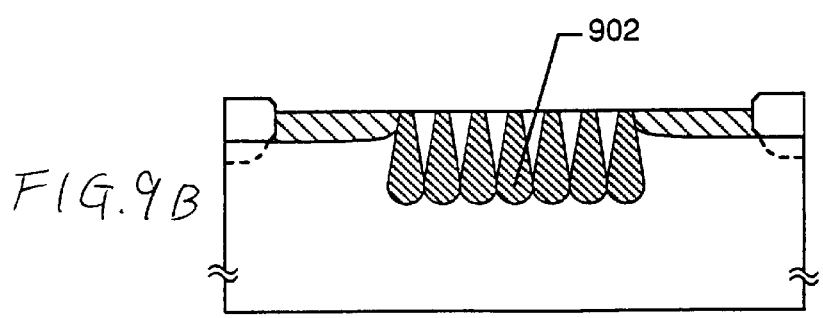

For example, generally, when ion is added by ion implanting method, an impurity region 901 which is shaped in wedges as shown in FIG. 9A is formed. Also, reversely, an impurity region 902 which is shaped in droplets as shown in FIG. 9B may be formed. In particular, in case of the shape shown in FIG. 9B, the impurity regions adjacent to each other on a lower portion of the impurity region 902 are in contact with each other.

In this state, it can be substantially regarded as an SOI structure where the channel forming region is insulatingly separated from a bulk substrate. This structure can extremely effectively restrain the drain side depletion layer from influencing the depletion layer of the channel forming region. Also, the effect that the depletion layer of the channel forming region is prevented from expanding downward can be expected.

Embodiment 4

The embodiment 1 shows an example in which the dot pattern (impurity region) is disposed in the form of a matrix as shown in FIG. 1A, but other various arrangement patterns can be provided by changing a design pattern.

Figure 10A:
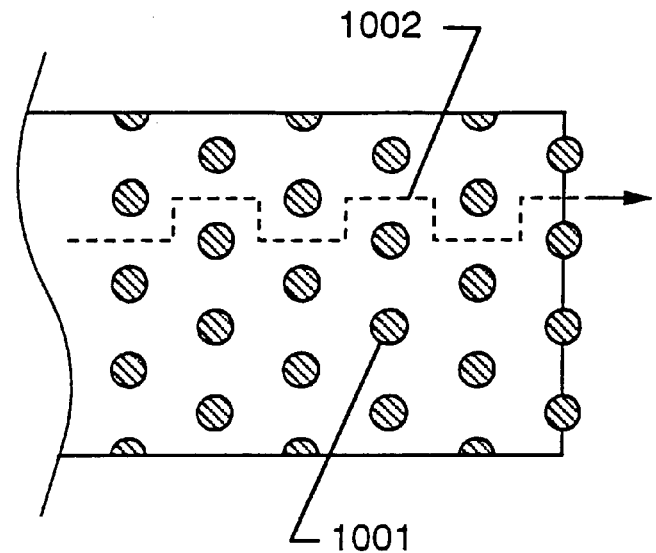
FIGS. 10A to 10C are diagrams for explaining the shape and arrangement of the impurity regions.

For example, as shown in FIG. 10A, a pattern such that impurity regions 1001 are alternately engaged with each other can be provided. In this example, since there is structured so that gaps between the dot patterns are supplemented by a next row, a lateral expansion of the drain side depletion layer can be effectively prevented. In particular, it is very effective in the IG-FET such that the influence of the short channel effect becomes extremely large as in the case where the channel length is 0.1 $\mu$m or less.

However, since a path along which carriers move is meandered as indicated by a dotted line, there is a possibility of lowering the mobility as much as a distance of the movement of carriers is increased. However, in a region where the channel length is 0.1 $\mu$m or less, at which this structure exhibits the effect, since the carriers going out of the source region reach the drain region in an instant, it is considered that there arises no problem even if the moving distance is somewhat increased.

Hence, it is desirable that in the case where the channel length is, for example, 0.1 μm or longer, the impurity regions shaped in a dot pattern are disposed as shown in FIG. 1A, and in the case where the channel length is 0.1 μm or shorter, they are disposed as shown in FIG. 10A.

Figure 10B:
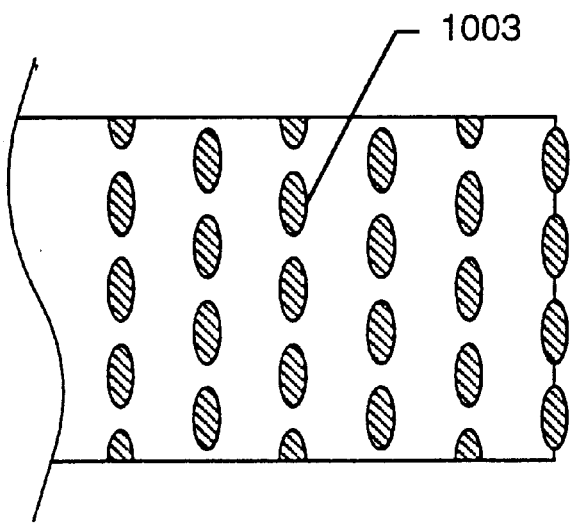

Also, as shown in FIG. 10B, the dot pattern can be shaped in an ellipse or a rectangle which are perpendicular to the channel direction. In this example, it is structured to be suitable to restrain the drain side depletion layer. However, because there is a possibility of obstructing the movement of carriers, it is preferable that the structure is applied to a semiconductor device which is very short in channel length of, for example, 0.2 μm or shorter.

Figure 10C:
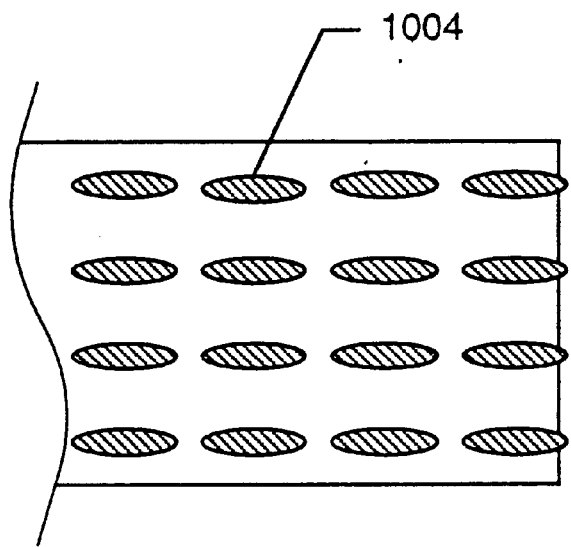

Further, as shown in FIG. 10C, the dot pattern can be shaped in an ellipse or a rectangle which are in parallel with the channel direction. In this example, since it is structured such that the narrow channel effect is more remarkably exhibited, it is effective to increase the threshold value voltage somewhat when required.

Embodiment 5

The present invention is applicable to not only the lateral IG-FET as described in the embodiment 1, but also IG-FETs of various structures. For example, the lateral IG-FET may have other structures such as an LDD (offset) structure (FIG. 11A), a double-drain structure (FIG. 11B), a buried channel structure (FIG. 11C), an SOI structure (FIG. 11D), an SIMOX structure (FIG. 11E) or the like.

In this embodiment, a case in which an n-channel FET is applied to the above structure as an example will be described. In the figure, N+ and N− represent the relative strength of the n-type conductivity, and N+ means the n-type conductivity stronger than N−.

Figure 11A:
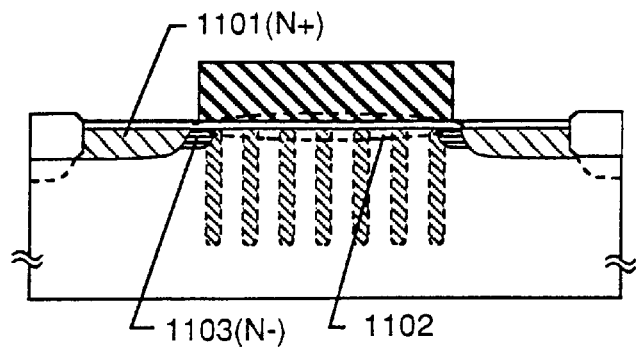
FIGS. 11A to 11E are diagrams showing the structure of the insulated gate field effect transistor.

FIG. 11A shows a structure in which a light doped impurity region 1103 is disposed between a source or drain region 1101 and a channel forming region 1102. Although the drain side depletion layer is liable to gently expand because the low-density impurity region 1103 exists, the present invention can restrain its expansion.

Figure 11B:
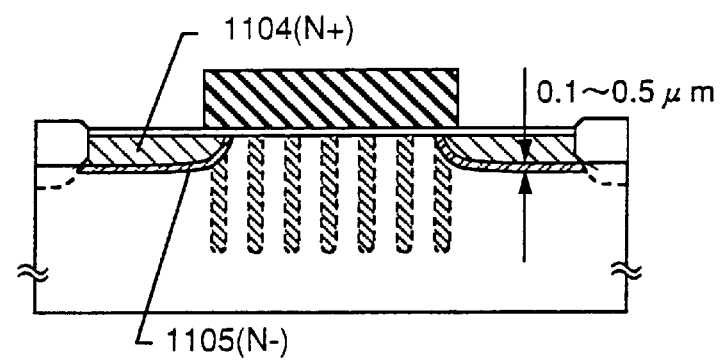

Also, FIG. 11B shows a structure in which conductive regions 1105 having a width of 0.1 to 0.5 μm are formed on both sides of a source or drain region 1104. The source or drain region 1104 is identical in conductivity with the conductive region 1105, and the conductive region 1105 is weaker in conductivity than the source or drain region 1104. For example, As (arsenic) is implanted to form the source or drain region 1104, P (phosphorus) is implanted to form a weak conductive region 1105.

Figure 11C:
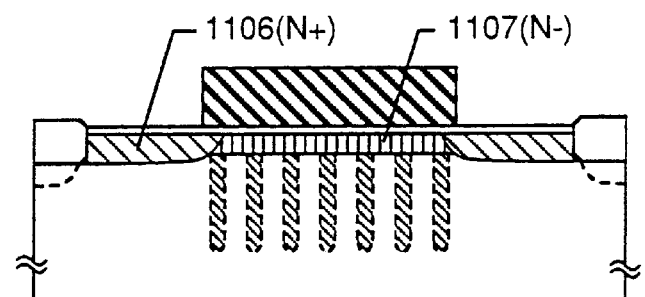

There are many cases in which the buried channel structure shown in FIG. 11C is formed resultantly when a CMOS circuit is structured by an n-channel FET and a p-channel FET, and such a structure is liable to be influenced by the short channel effect.

Structurally, for example, in the n-channel FET, a conductive region 1107 which is identical in conductivity with and weaker in conductivity than the source/drain region 1106 is formed in the vicinity of an interface of the channel forming region.

Therefore, a channel is formed immediately below the conductive region 1107, and similarly in this case, the present invention is implemented with the results that the short channel effect can be restrained, and the punch-through phenomenon and the reduction of the threshold value voltage can be prevented.

Figure 11D:
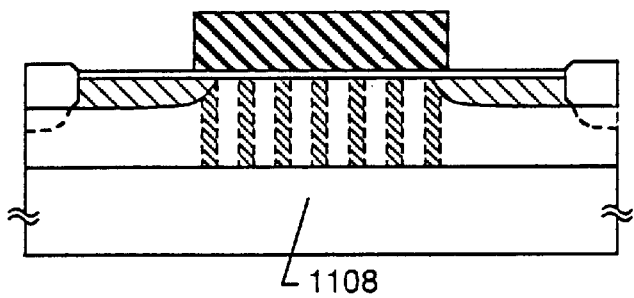

Further, since the SOI structure is of a technique which has been developed with a purpose of thinning the semiconductor layer which is used as a device to reduce the depletion layer, the SOI structure per se provides the effect of restraining the short channel effect. For example, the structure shown in FIG. 11D is generally called "SOS (silicon-on-sapphire) structure", which is formed by allowing silicon monocrystal to grow on a sapphire substrate 1108.

However, it is difficult to form a monocrystal silicon layer of 1 μm or less, and there is a limit of restraining the expansion of the depletion layer. Therefore, if the present invention is applied to the SOI structure, it is possible to more surely prevent the short channel effect.

Figure 11E:
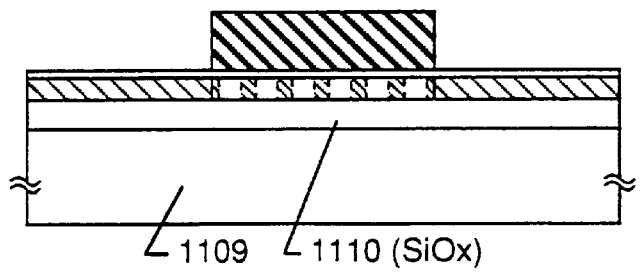

An example in which an IG-FET is formed on a substrate which is generally called "SIMOX (separation-by-implanted oxygen) although it belongs to the above-mentioned SOI structure is shown in FIG. 11E. In this example, oxygen is implanted into a monocrystal silicon substrate 1109, to thereby form an buried oxide layer 1110. Also, a depth of implantation of oxygen is made shallow, thereby being capable of forming a monocrystal thin film which is extremely thin.

Even in the above example, the present invention is applicable thereto. In this case, there can be expected such an effect as to restrain (pin) the expansion of the drain side depletion layer toward the channel forming region.

Embodiment 6

In the present invention, as a means for forming an impurity region in the channel forming region, there can be applied a method of employing a property that impurities are segregated by a distortion, a property that the impurities are taken into an oxide, or other properties, other than a method of patterning with a resist mask.

Figure 12A:
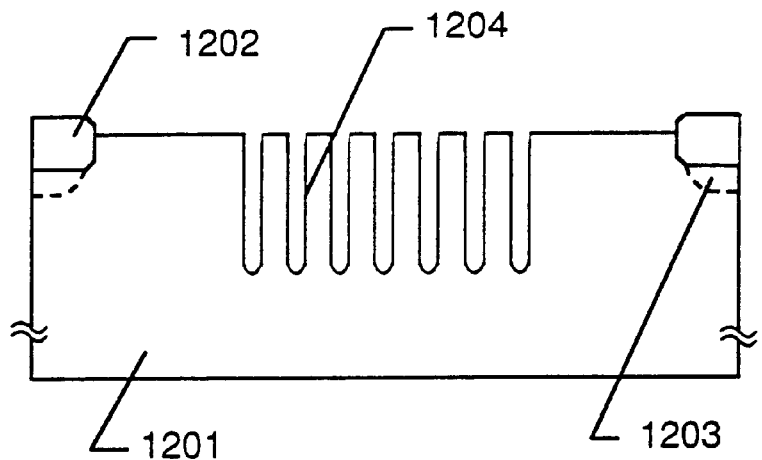
FIGS. 12A to 12C are diagrams showing a process of manufacturing the impurity regions.

First, a state identical with that shown in FIG. 7B is obtained in accordance with a process described in the embodiment 1. In FIG. 12A, reference numeral 1201 denotes a silicon substrate, reference numeral 1202 denotes a field oxide film, and reference numeral 1203 denotes a channel stopper.

In this state, an anisotropic etching process is conducted locally on the surface of a silicon substrate by using a convergent ion beam or the like, to thereby draw a groove-like or hole-like pattern 1204 in a desired shape at a desired position (FIG. 12A).

Figure 12B:
Figure 12B:
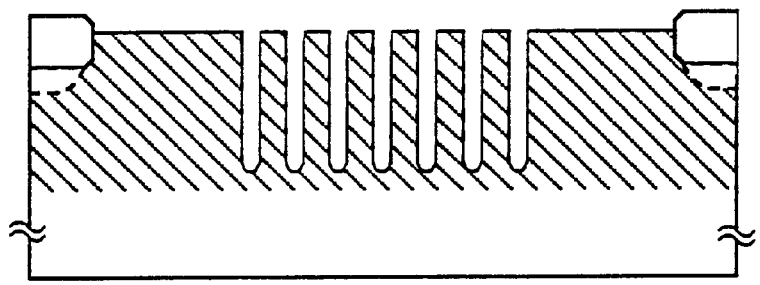
Figure 12C:
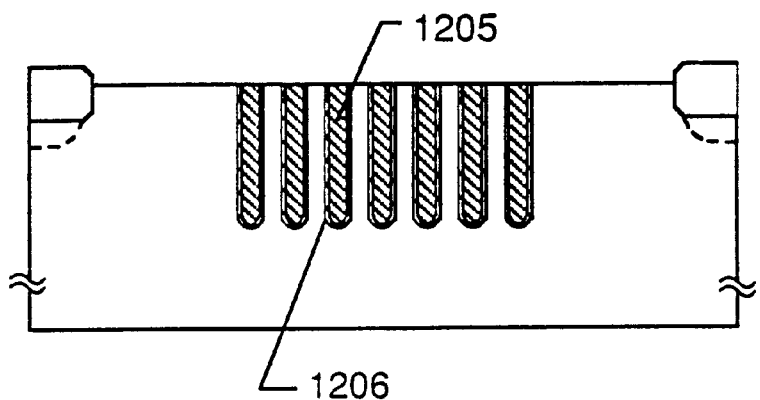

Next, the impurity elements (in this example, boron) are added to the entire surface of the substrate 1201. The impurity elements are used to form the impurity regions of the n-channel FET later. Also, it is desirable that a depth of implantation is deeper than the groove-like or hole-like pattern 1204 (FIG. 12B).

After completion of addition of the impurity elements, a heat treatment is conducted at a high temperature of about 1000 to 1200° C. Through this heat treatment, a heat oxide film is formed on both side walls of the groove-like or hole-like pattern 1204 so that the groove-like or hole-like pattern 1204 is buried. Therefore, this region substantially comes to an oxide region 1205 as represented by SiOx. In this case, it is preferable that the heat treatment is conducted in an oxidation atmosphere because a rate of forming the oxide region 1205 increases.

Simultaneously, the impurity elements (boron) which have been added to the entire silicon substrate 1201 are taken into the oxide region 1205. How is the distribution of the concentration of boron or phosphorus in the vicinity of an interface between the heat oxide film and silicon will be described with reference to FIG. 17.

As shown in FIG. 17, the added ions (B, P) that exist in Si are re-distributed when an oxide film is formed thereon. This is a phenomenon that occurs because the solubility and the rate of diffusion of the added ions are different in silicon (Si) and the heat oxide film (SiOx). Assuming that the solubility of the impurities in Si is $[C]_{Si}$ and the solubility of the impurities in SiOx is $[C]_{SiOx}$, the equilibrium segregation coefficient m is defined by the following expression.

$$m=[C]_{Si}/[C]_{SiOx}$$

Figure 17A:
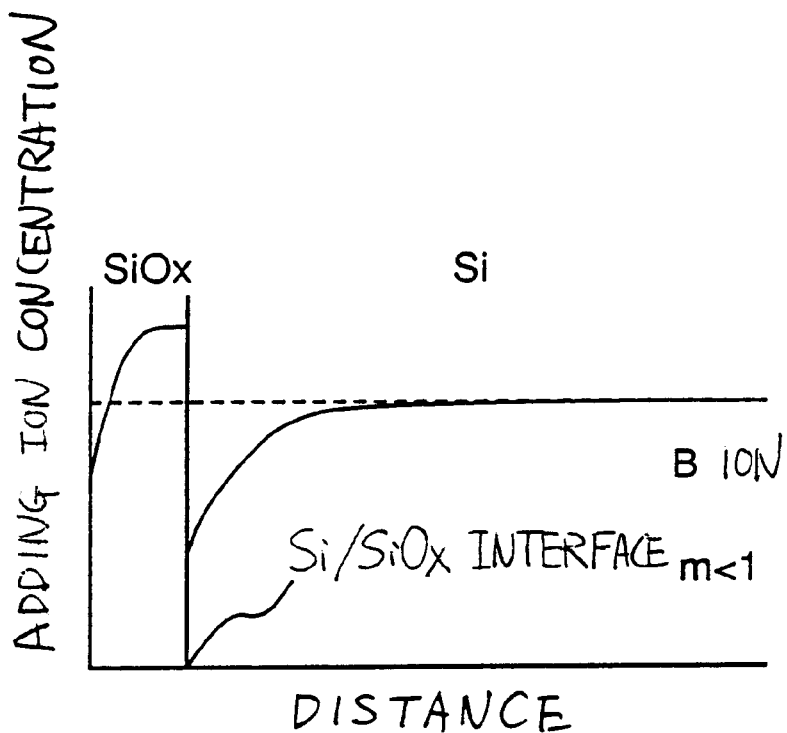
FIGS. 17A and 17B are diagrams for explaining a state of segregation of impurities.

In this case, the segregation of the impurities in the vicinity of an interface between Si and SiOx is controlled by a value of m. Normally, assuming that the diffusion coefficient of the impurities in Si is sufficiently large, in case of m<1, the impurities in Si are taken into $SiO_2$ (FIG. 17A). Also, in case of m>1, SiOx excludes the impurities, as a result of which the concentration of the impurities in the vicinity of the interface increases (FIG. 17B).

According to a literature, the value of m of boron is about 0.3, and the value of m of phosphorus is about 10. Hence, the distribution of concentration of boron after the heat oxidizing process is exhibited as shown in FIG. 17A, and boron is taken into the heat oxide film in such a manner that the concentration of boron on both of side surfaces of the impurity regions 1206 (in the vicinity of the interface between Si and SiOx) comes to a state where its amount is very small. Reversely, a large amount of boron is contained in the oxide 1205 formed.

Although such a phenomenon that boron is taken into the heat oxide film has already been known, an idea of employing the phenomenon in order to form an energy barrier (an impurity region) as in the present invention is completely novel.

Figure 17B:
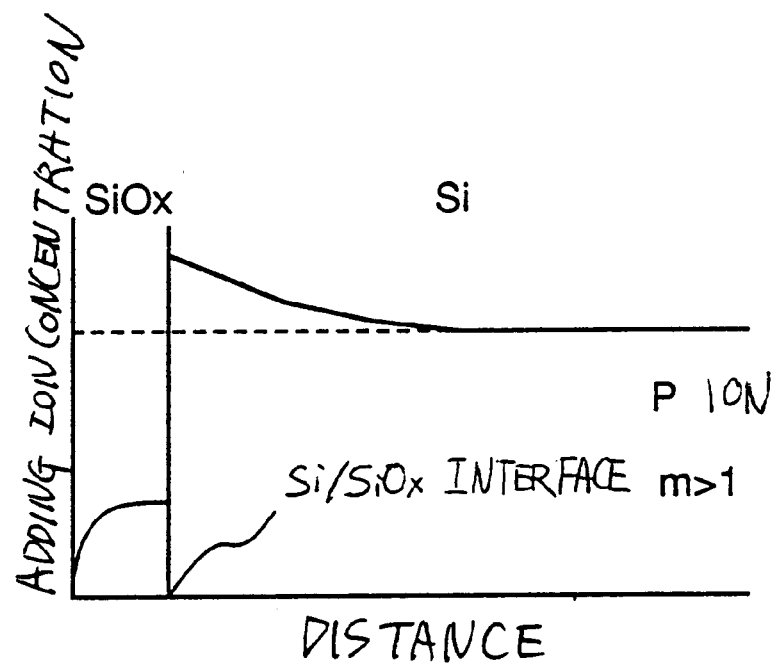

It should be noted that as shown in FIG. 17B, in the case of using phosphorus as the impurity elements, phosphorus is segregated (piled up) to the interface of the oxide film and silicon. The phenomenon can also be applied in forming the impurity regions in the p-channel FET.

Also, in the case where the impurity elements that give one conductivity such as phosphorus or boron are added to the monocrystal silicon substrate 1201 in order to give conduction to the monocrystal silicon substrate 1201, the phenomenon of segregating phosphorus or boron to an oxide is employed as in the present invention, thereby being capable of remarkably improving the mobility.

This is because when this embodiment is implemented, since the impurities (phosphorus or boron) in the periphery of the impurity region (representatively an oxide represented by SiOx) are caused to be collected in the impurity regions, an influence of scattering of the impurities in a region where carriers move between the impurity regions can be remarkably reduced.

Since this means that $\mu_i$ increases in expression 5 as described above, the entire mobility $\mu$ approaches $\mu=\mu_l$. In other words, an extremely large mobility can be realized which is substantially determined by only scattering of the lattice.

Also, other than a method of forming the groove as in this embodiment, there can be applied, for example, the following method. Using a device which is capable of conducting ion implantation in a maskless manner such as a convergent ion beam, oxygen ions are directly implanted into a monocrystal silicon substrate to conduct a heat treatment, thereby being capable of changing the region into which ions are implanted into an oxide region. The convergent ion beam may be replaced by an electron beam or the like.

Embodiment 7

This embodiment shows an example in which the semiconductor device of the present invention is installed into a product (an electronic equipment). In this case, an example of an IC circuit installed into a note-type personal computer will be described with reference to FIG. 17.

Figure 18:
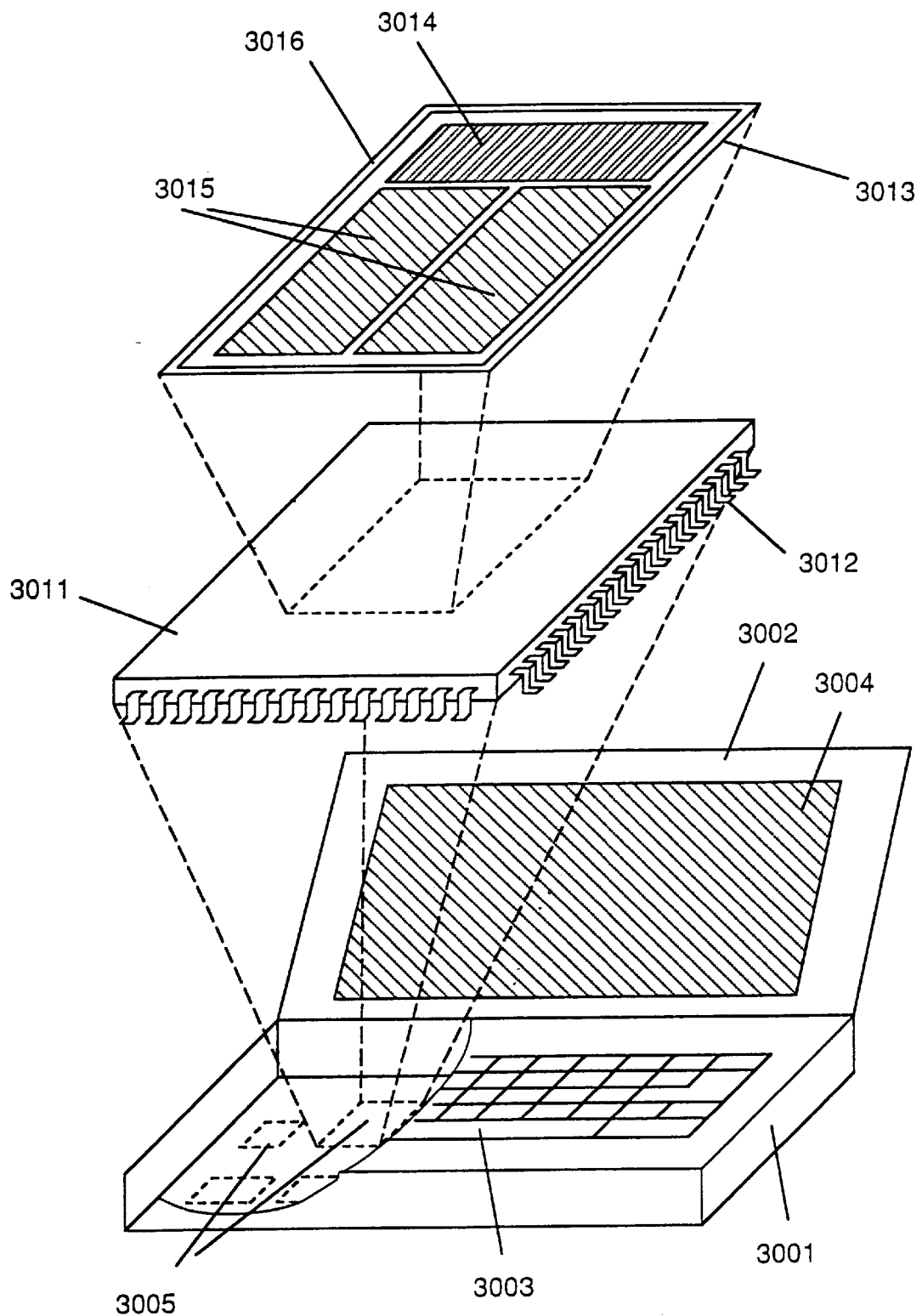
FIG. 18 is a diagram showing an applied example of he semiconductor device.

In FIG. 18 reference numeral 3001 denotes a main body, reference numeral 3002 denotes a cover section, reference numeral 3003 denotes a key board, and reference numeral 3004 denotes an image display section, where a variety of integrated circuits 3005 are installed into the main body 3001.

Drawing out the integrated circuit 3005 from the main body, an external of the integrated circuit 3005 is covered with a package 3011, and an internal semiconductor chip is protected with resin or the like. Also, the internal semiconductor chip is connected to the external through leads 3012. Normally, when the integrated circuit (IC chip) 3005 is viewed, since only the black package 3011 and the leads 3012 can be viewed from the external, the integrate circuit 3005 is completely a black box.

Drawing out the semiconductor chip protected with the package 3011 from the main body, it is structured, for example, as follows. First, an arithmetic operating section (processor) 3014 and a memory section 3015 are disposed on a substrate 3013. Reference numeral 3016 denotes a bonding section where the semiconductor device and the leads 3012 are connected to each other.

The arithmetic operating section 3014 and the memory section 3015 are made up of a variety of circuits including a CMOS circuit, a BiCMOS circuit, a DRAM circuit, an SRAM circuit and the like. The structure of this embodiment as shown in FIG. 15 is characterized in that the arithmetic operating section 3014 and the memory section 3015 are disposed on the same substrate.

When the arithmetic operating section 3014 and the memory section 3015 are arranged to be adjacent to each other as described above, because a delivery of data between the arithmetic operating section 3014 and the memory section 3015 is conducted at a very high speed, it is possible to form a circuit high in operating speed.

Also, since all the circuits as required can be integrated on one chip, it can be expected that the manufacture costs can be remarkably reduced. Furthermore, an arrangement area is reduced with the result that the product can be downsized.

Since, according to the present invention, the semiconductor device can be fined without suffering from a problem such as the short channel effect, the semiconductor electronic equipment can be further downsized and made portable with being used as the above-mentioned one chip.

Embodiment 8

The present invention can be applied to a variety of semiconductor electronic equipments other than the example described in the embodiment 7. This is because the electric characteristics of the semiconductor device according to the present invention are very excellent, and the IC circuit structured using that semiconductor device can realize a high frequency characteristic.

The device characteristic of the single semiconductor device formed according to the present invention is very excellent, and the threshold value voltage Vth,n of the n-channel FET and the threshold value voltage Vth,p of the p-channel FET can be adjusted within a range of −0.5 to 3.0 V and within a range of −0.3 to 0.5 V in accordance with a required drive voltage, respectively. Also, the S-value as obtained is 60 to 85 mV/decade, preferably, 60 to 70 mV/decade.

Also, for the reason described in Embodiment 1, a high mobility (1000 cm$^2$/Vs or more) can be obtained. In the case where the mobility is obtained through an arithmetic expression, attention must be paid because the mobility is in reverse proportion to the channel width W. In the case where the present invention is implemented, since the channel width is somewhat narrowed by the impurity regions in the channel forming region, the actual mobility cannot be obtained unless the channel width is replaced by the actually measured channel width Wpa.

When the IC circuit is made up of the semiconductor device of the present invention, which can achieve the excellent electric characteristics as described above, a remarkably excellent frequency characteristic can be obtained. For example, when a 9-stage ring oscillator is made up of the semiconductor devices of the present invention, the frequency characteristic of 2 to 10 GHz can be realized with a drive voltage of 3.3 V.

For example, the present invention is effective to an electronic equipment that requires a high frequency characteristic as in a portable telephone which is a high-frequency electronic equipment. Although an IC circuit used for an input section, etc., of the portable telephone requires the frequency characteristic of 2 GHz, the present invention can be satisfactorily applied to the high-frequency IC circuit of this type.

As was described above, the present invention can prevent the short channel effect caused when the channel length becomes short. In particular, first, the expansion of the drain side depletion layer to the source region or the channel forming region is blocked by the impurity regions which are locally formed in the channel forming region so that the drain voltage is not influenced by the energy (potential) state of the channel forming region. As a result, it is possible to prevent the punch-through phenomenon and the reduction of the sub-threshold characteristic. Also, a high drain withstand voltage can be realized, simultaneously.

Further, the reduction of the threshold value voltage which is one feature of the short channel effect can be restrained by an increase of the threshold value voltage which is caused by the narrow channel effect. The narrow channel effect is an effect which is artificially performed by the structure of the present invention that the impurity regions are locally formed in the channel forming region.

As was described above, according to the present invention, even in the semiconductor device in the deep sub-micron region which is short in channel length, operation can be conducted without leading to the short channel effect. In other words, the semiconductor device represented by the IG-FET is hopefully further integrated and improved in performance.

What is claimed is:

1. An insulated gate semiconductor device, comprising:

a source region, a drain region and a channel forming region which are formed in a semiconductor having a major surface; and a gate insulating film and a gate electrode formed on said channel forming region;

wherein said channel forming region includes a region in which carriers move and a plurality of impurity regions for pinning a depletion layer that expands from said drain region toward said channel forming region and said source region, each impurity region having a circular shape on said major surface of said semiconductor; and wherein impurity elements that shift an energy bandwidth (Eg) of said channel forming region are added to said impurity region, and said impurity elements have a conductivity type opposite to that of the source and drain regions, wherein widths of said impurity regions in a channel width direction Wpi is in a range of 10 to 100 Å and widths between said impurity regions in said channel width direction Wpa is in a range of 100 to 3000 Å.

2. An insulated gate semiconductor device, comprising:

a source region, a drain region and a channel forming region which are formed in a semiconductor having a major surface; and a gate insulating film and a gate electrode formed on said channel forming region;

wherein said channel forming region includes a region in which carriers move and a plurality of impurity regions for pinning a depletion layer that expands from said drain region toward said channel forming region and said source region, each impurity region having a circular shape on said major surface of said semiconductor; and wherein impurity elements that shift an energy bandwidth (Eg) of said channel forming region are added to said impurity region and said impurity elements have a conductivity type opposite to that of the source and drain regions; and wherein said impurity regions are arranged in a matrix form.

3. An insulated gate semiconductor device, comprising:

a source region, a drain region and a channel forming region which are formed in a semiconductor having a major surface; and a gate insulating film and a gate electrode formed on said channel forming region;

wherein said channel forming region includes a region in which carriers move and a plurality of impurity regions in order to control a threshold voltage of said semiconductor device to a predetermined value by the addition of impurity elements, each impurity region having a circular shape on said major surface of said semiconductor;

wherein said impurity elements shift an energy band width (Eg) of the channel forming region and said impurity elements have a conductivity type opposite to that of the source and drain regions, and wherein a depth of said impurity regions is deeper than the source and drain regions ans a field oxide film in the semiconductor.

4. An insulated gate semiconductor device, comprising:

a source region, a drain region and a channel forming region which are formed in a semiconductor having a major surface; and a gate insulating film and a gate electrode formed on said channel forming region;

wherein said channel forming region includes a region in which carriers move and a plurality of impurity regions in order to control a threshold voltage of said semiconductor device to a predetermined value by the addition of impurity elements, each impurity region having a circular shape on said major surface of said semiconductor;

wherein said impurity elements shift an energy bandwidth (Eg) of said channel forming region and said impurity elements have a conductivity type opposite to that of the source and drain regions; and wherein an arrangement in a channel length direction of the impurity regions is substantially parallel to or makes an angle within ±10° with an axial direction of crystal lattices in said channel forming region.

5. A device as claimed in claims 3 or 4, wherein said impurity regions make the threshold voltage increase due to a narrow channel effect thereby easing a short channel effect of decreasing the threshold voltage.

6. A device as claimed in claims 3 or 4, wherein carriers move between the source region and the drain region in a region other than said impurity regions.

7. An insulated gate semiconductor device, comprising:

a source region, a drain region and a channel forming region which are formed in a semiconductor having a major surface; and a plurality of impurity regions formed in said channel forming region by addition of impurity elements that shift an energy band width (Eg) of said channel forming region; and a gate insulating film and a gate electrode formed over said channel forming region;

wherein said impurity regions have an insulating property thereby carriers move in regions except said impurity regions in said channel forming region; and wherein said impurity elements have a conductivity type opposite to that of the source and drain regions, and wherein a section of perpendicular to said major surface of each impurity region is in a bar form, a wedge form, or a droplet form.

8. A device as claimed in any one of claims 2 to 7, wherein widths of said impurity regions in a channel width direction Wpi, widths between said impurity regions in said channel width direction Wpa, and width of said channel forming region W satisfy relational expressions of Wpi/W=0.1 to 0.9, Wpa/W=0.1 to 0.9 and Wpi/Wpa=⅑ to 9.

9. A device as claimed in any one of claims 1 to 5, wherein at least one section perpendicular to a channel direction of said channel forming region is substantially regarded as an assembly of a plurality of narrow channel forming regions which are sectioned by said impurity regions.

10. A device as claimed in any one of claims 1 to 7, wherein said region in which the carriers move other than said impurity regions in said channel forming region is intrinsic or substantially intrinsic regions.

11. A device according to claim 8, wherein a value of said Wpi is in a range of 10 to 100 Å and a value of said Wpa is in a range of 100 to 3000 Å.

12. A device as claimed in claims 1, 2 or 7, wherein a threshold voltage of said semiconductor device is adjusted to a predetermined value according to the concentration of the impurity elements which have been added to said impurity regions.

13. A device as claimed in any one of claims 1 to 7, wherein said semiconductor is a monocrystal semiconductor.

14. A device as claimed in any one of claims 1 to 7, wherein said impurity elements are elements of group XIII or XV.

15. A device according to claim 14, wherein the elements of group XIII comprise boron, and the elements of group XV comprise at least one of phosphorus and arsenic.

16. A device as claimed in any one of claims 1, 3, 4, or 7, wherein said impurity regions are arranged in a matrix form.

17. A device as claimed in any one of claims 1 to 7, wherein a concentration of said impurity elements in said impurity regions is $1\times10^{17}$ to $1\times10^{20}$ atoms/cm$^3$.

18. A device as claimed in any one of claims 1 to 7, wherein a channel length of said channel forming region is in a range of 0.01 to 0.35 $\mu$m.

19. A device as claimed in any one of claims 3 to 7, wherein said impurity regions function as a stopper of a drain depletion layer in said semiconductor.

20. A device as claimed in any one of claims 1 to 4, wherein a section of perpendicular to said major surface of each impurity region is in a bar form, a wedge form, or a droplet form.

21. A device as claimed in claims 1, 2, 4, or 7, wherein a depth of said impurity regions is deeper than the source and drain regions and a field oxide film in the semiconductor.

22. A device as claimed in any one of claims 1 to 7, wherein said source and drain regions comprise silicide regions, respectively.

23. A device as claimed in any one of claims 1–7, wherein said semiconductor device is selected from the group consisting of a portable telephone and a notebook-type personal computer.

24. A semiconductor device, comprising:

a source region, a drain region and a channel forming region which are formed in a semiconductor having a major surface; and a gate insulating film and a gate electrode formed on said channel forming region, wherein said channel forming region includes a plurality of impurity regions, each impurity region has a circular shape on said major surface of said semiconductor, wherein said impurity regions include a material having a conductivity opposite to that of the source and drain regions, wherein length of the channel forming region is 0.01–1.0 $\mu$m, and wherein a depth of said impurity regions is deeper than the source and drain regions and a field oxide film in the semiconductor.

25. A semiconductor device, comprising:

a source region, a drain region and a channel forming region which are formed in a semiconductor having a major surface; and a gate insulating film and a gate electrode formed on said channel forming region, wherein said channel forming region includes a region in which carriers move and a plurality of impurity regions, each impurity region has a circular shape on said major surface of said semiconductor, wherein said impurity regions contain a material having a conductivity opposite to that of the source and drain regions, wherein said impurity regions are arranged in a matrix form.

26. A device according to claim 25 wherein said material is selected from the group consisting of boron, phosphorus, and arsenic.

27. A semiconductor device, comprising:

a source region, a drain region and a channel forming region which are formed in a semiconductor having a major surface; and a gate insulating film and a gate electrode formed on said channel forming region, wherein said channel forming region includes a region in which carriers move and a plurality of impurity regions, each impurity region has a circular shape on said major surface of said semiconductor, wherein said impurity regions contain a material having a conductivity opposite to that of the source and drain regions, wherein said region in which the carriers move includes carbon, nitrogen and oxygen at concentrations of $2 \times 10^{18}$ atoms/cm$^3$ or less, respectively, wherein an arrangement in a channel length direction of the impurity regions is substantially parallel to, or makes an angle within ±10° with, an axial direction of crystal lattice in said channel forming region.

28. A device as claimed in claims 24, 25, or 27, wherein said semiconductor device is selected from the group consisting of a portable telephone and a notebook-type personal computer.

29. A semiconductor device, comprising:

a source region, a drain region and a channel forming region which are formed in a semiconductor having a major surface; and a gate insulating film and a gate electrode formed on said channel forming region, wherein said channel forming region includes a region in which carriers move and a plurality of impurity regions, each impurity region has a circular shape on said major surface of said semiconductor, wherein said impurity regions are arranged in a matrix form, and wherein said semiconductor device is selected from the group consisting of a portable telephone and a notebook-type personal computer.

30. A device as claimed in claims 24, 25, 27 or 29, wherein a channel length of said channel forming region is in a range of 0.01 to 0.35 μm.

31. A device as claimed in claims 24, 25, 27, or 29, wherein said impurity regions function as a stopper of a drain depletion layer in said semiconductor.

32. A device as claimed in claims 24, 25, 27, or 29, wherein a section of perpendicular to said major surface of each impurity region is in a bar form, a wedge form, or a droplet form.

33. A device as claimed in claims 25, 27, or 29, wherein a depth of said impurity regions is deeper than the source and drain regions and a field oxide film in the semiconductor.

34. A device as claimed in claims 24, 25, 27, or 29, wherein said source and drain regions comprise silicide regions, respectively.

35. A device as claimed in claims 24, 25, 27, or 29, wherein a threshold voltage of said semiconductor device is controlled according to a concentration of the impurity elements added to said impurity regions, and wherein carriers move between the source region and the drain region in a region other than said impurity regions in said channel forming regions.

36. A device as claimed in claims 24, 25, or 29, wherein said material is selected from the group consisting of boron, phosphorus, and arsenic.

37. A device as claimed in claims 24, 25, or 29, wherein an arrangement in a channel length direction of the impurity regions is substantially parallel to, or makes an angle within ±10° with, an axial direction of crystal lattices in said channel forming region.

* * * * *